(12) United States Patent
Lee

(10) Patent No.: US 10,424,623 B2
(45) Date of Patent: Sep. 24, 2019

(54) DISPLAY PANEL AND A DISPLAYING APPARATUS USING THE SAME

(71) Applicant: SAMSUNG ELECTRONICS CO., LTD., Suwon-si, Gyeonggi-do (KR)

(72) Inventor: Kye Hoon Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 27 days.

(21) Appl. No.: 14/937,065

(22) Filed: Nov. 10, 2015

(65) Prior Publication Data
US 2017/0017123 A1    Jan. 19, 2017

(30) Foreign Application Priority Data

Jul. 14, 2015    (KR) ........................ 10-2015-0099951

(51) Int. Cl.
| | | |
|---|---|---|
| *H01L 27/32* | (2006.01) | |
| *G02F 1/335* | (2006.01) | |
| *G02F 2/02* | (2006.01) | |
| *F21V 8/00* | (2006.01) | |
| *F21V 9/30* | (2018.01) | |

(Continued)

(52) U.S. Cl.
CPC .......... *H01L 27/322* (2013.01); *G02B 6/0051* (2013.01); *G02F 1/133514* (2013.01); *G02F 1/133528* (2013.01); *G02F 1/133605* (2013.01); *G02F 1/133606* (2013.01); *G02F 1/133609* (2013.01); *G02F 2/02* (2013.01); *F21V 9/30* (2018.02); *G02F 2001/133614* (2013.01); *G02F 2201/08* (2013.01); *G02F 2202/36* (2013.01); *G09G 3/3607* (2013.01); *H01L 51/5268* (2013.01); *H01L 2251/5369* (2013.01)

(58) Field of Classification Search
CPC ... G02B 6/0003; G02F 2/02; G02F 1/133609; G02F 2001/133614; G02F 1/133514; H01L 27/322
See application file for complete search history.

(56) References Cited

U.S. PATENT DOCUMENTS

| | | |
|---|---|---|
| 2006/0274226 A1 | 12/2006 | Im et al. |
| 2007/0007881 A1 | 1/2007 | Kim et al. |

(Continued)

FOREIGN PATENT DOCUMENTS

| | | |
|---|---|---|
| KR | 10-2012-0111369 | 10/2012 |
| KR | 10-2014-0042274 | 4/2014 |
| KR | 10-2014-0094806 | 7/2014 |

OTHER PUBLICATIONS

Search Report dated May 27, 2016 in counterpart International Application No. PCT/KR2015/013041.

(Continued)

*Primary Examiner* — Jessica M Merlin
(74) *Attorney, Agent, or Firm* — Nixon & Vanderhye P.C.

(57) ABSTRACT

Disclosed are a display panel and a display device. The display panel includes a quantum dot converter configured to convert light of a predetermined color emitted from a light source into light of a different color using a quantum dot unit and emit the converted light; and a light transmitter configured to transmit a part of the light of the predetermined color emitted from the light source and convert a remaining part of the light of the predetermined color into light of a different color and emit the converted light.

3 Claims, 26 Drawing Sheets

(51) Int. Cl.
  *G09G 3/36* (2006.01)
  *H01L 51/52* (2006.01)
  *G02F 1/1335* (2006.01)

(56) References Cited

U.S. PATENT DOCUMENTS

| | | |
|---|---|---|
| 2013/0235554 A1 | 9/2013 | McDavitt |
| 2013/0242228 A1* | 9/2013 | Park ................. G02F 1/133617 349/61 |
| 2014/0119052 A1* | 5/2014 | Hayama ................. C09K 11/06 362/611 |
| 2014/0158982 A1 | 6/2014 | Park et al. |
| 2014/0160408 A1* | 6/2014 | Cho ................. G02F 1/133617 349/110 |
| 2014/0192294 A1* | 7/2014 | Chen ..................... F21V 9/08 349/69 |
| 2014/0204128 A1 | 7/2014 | Jiang |
| 2014/0293186 A1 | 10/2014 | Ek et al. |
| 2015/0048348 A1* | 2/2015 | Huang ................. H01L 27/322 257/40 |
| 2015/0085223 A1 | 3/2015 | Park et al. |
| 2016/0003450 A1* | 1/2016 | Lee ....................... H01L 33/505 362/84 |

OTHER PUBLICATIONS

Extended Search Report dated Dec. 5, 2016 in counterpart European Patent Application No. 15201430.4.
EP Examination Report for EP Application No. 15201430.4 dated Aug. 18, 2017.
European Examination Report dated Apr. 6, 2018 for EP Application No. 15 201 430.4.
European Office Action dated Jan. 29, 2019 for EP Application No. 15201430.4.

* cited by examiner

|   | sRGB | | DCI-P3 | | QD color filter (PREDICTIVE VALUE) | |
|---|---|---|---|---|---|---|
|   | x | y | x | y | x | y |
| R | 0.64 | 0.33 | 0.68 | 0.32 | 0.685 | 0.315 |
| G | 0.3 | 0.6 | 0.265 | 0.68 | 0.263 | 0.689 |
| B | 0.15 | 0.06 | 0.15 | 0.06 | 0.157 | 0.019 |

FIG.10

|   | sRGB | | DCI-P3 | | QD color filter | |
|---|---|---|---|---|---|---|
|   | x | y | x | y | x | y |
| R | 0.64 | 0.33 | 0.68 | 0.32 | 0.685 | 0.315 |
| G | 0.3 | 0.6 | 0.265 | 0.68 | 0.263 | 0.689 |
| B | 0.15 | 0.06 | 0.15 | 0.06 | 0.153 | 0.051 |

Z1: Z11~Z16

DISPLAY PANEL AND A DISPLAYING APPARATUS USING THE SAME

CROSS-REFERENCE TO RELATED APPLICATION

This application is based on and claims priority under 35 U.S.C. § 119 to Korean Patent Application No. 10-2015-0099951, filed on Jul. 14, 2015 in the Korean Intellectual Property Office, the disclosure of which is incorporated by reference herein in its entirety.

BACKGROUND

1. Field

The disclosure relates to a display panel and a display device using the display panel.

2. Description of Related Art

Display devices are types of output devices configured to convert acquired or stored electric information into visual information and display it to a user, and are used in various places such as homes, workplaces, or the like.

The display devices are capable of outputting an image to the outside using display units of various types. The above display unit may be a cathode ray tube (CRT), a liquid crystal display (LCD), a light emitting diode (LED), an organic light emitting diode (OLED), an active matrix OLED, electronic papers, or the like.

The display devices, for example, include a television, various audio/video systems, a computer monitor device, a navigation terminal device, various portable terminal devices, or the like, and the portable terminal devices include a notebook computer device, a smartphone, a tablet PC, a personal digital assistant (PDA), a cellular phone, or the like. Additionally, various devices used in various industrial fields and configured to display still images or moving images may also be examples of the display devices. The display devices sometimes have problems with color reproducibility and display accuracy of a blue color.

SUMMARY

It is an aspect of the disclosure to provide a display panel having improved color reproducibility and a display device using the display panel.

It is another aspect of the disclosure to provide a display panel capable of outputting improved display accuracy of a blue color and a display device using the display panel.

Additional aspects of the disclosure will be set forth in part in the description which follows and, in part, will be apparent from the description.

In order to solve the above problems, a display panel and a display device are provided.

In accordance with one example of the disclosure, a display panel includes a quantum dot converter (e.g., a flexible or rigid film or layer, or the like) comprising at least one quantum dot element, said quantum dot converter configured to convert light of a predetermined color emitted from a light source into light of a different color using at least one quantum dot element, and to emit the converted light; and a light transmitter configured to transmit a part of the light of the predetermined color emitted from the light source and to convert a remaining part of the light of the predetermined color into light of a different color and to emit the converted light.

The light transmitter may include a main body comprising a light transmitting material; and at least one converting element dispersed in the main body and configured to convert a part of the light of the predetermined color into light of a different color.

The light of the predetermined color may include blue-based light, and the at least one converting element may include a first green light converting element configured to convert the blue-based light into green-based light.

The at least one first green light converting element may include at least one of a green quantum dot particle and a green fluorescent particle.

The light transmitter may further include at least one dispersion particle distributed in the main body and configured to disperse all or a part of incident light of the predetermined color.

The at least one dispersion particle may include at least one of zinc oxide, titanium oxide, and silicon oxide.

The light transmitting material may include at least one of a natural resin, a synthetic resin, and glass.

The display panel may further include a filter configured to filter a part of the light emitted from the quantum dot converter.

The quantum dot converter may include a first emitting surface through which light is emitted, and the filter may be installed to be in contact with the first emitting surface.

The filter may include a blue light cut-off filter configured to filter blue-based light of the light emitted from the quantum dot converter.

The light of the predetermined color may include blue-based light, and the quantum dot converter may include at least one of: at least one red light quantum dot element configured to convert the blue-based light and emit red light; and at least one green light quantum dot element configured to convert the blue-based light and emit green light.

The display panel may further include a substrate on which the quantum dot converter and the light transmitter are disposed, and the at least one red light quantum dot element, the at least one green light quantum dot element, and the light transmitter may be disposed in a predetermined pattern.

At least one of the at least one red light quantum dot element and the at least one green light quantum dot element may be disposed on the substrate in a greater number than the light transmitter.

At least one of a third emitting surface of the at least one red light quantum dot element and a fourth emitting surface of the at least one green light quantum dot element may be wider than a second emitting surface of the light transmitter.

The display panel may further include a liquid crystal layer including liquid crystal particles in which arrangement thereof is adjusted based on application of a current, and configured to selectively polarize the light of the predetermined color emitted from the light source or transmit without polarization, wherein the transmitted light reaches at least one of the quantum dot converter and the light transmitter.

The light source may further include a blue light emitter configured to emit blue-based light; and a second green light converting element configured to absorb a part of the blue-based light emitted from the blue light emitter and emit green light.

In accordance with another example of the disclosure, a display device includes at least one light source configured to emit light of a predetermined color; and a quantum dot sheet including a quantum dot converter configured to convert the light of the predetermined color emitted from the light source into light of a different color using a quantum dot element and emit the converted light; and a light transmitter configured to transmit a part of the light of the predetermined color emitted from the light source and to convert a remaining part of the light of the predetermined color into light of a different color and emit the converted light.

The light transmitter may include a main body formed of a light transmitting material; and at least one converting element dispersed in the main body and configured to convert a part of the light of the predetermined color into light of a different color.

The light of the predetermined color may include blue-based light, and the at least one converting element may include a first green light converting element configured to convert the blue-based light into green light.

The at least one first green light converting element may include at least one of a green quantum dot particle and a green fluorescent particle.

The light transmitter may further include at least one dispersion particle distributed in the main body and configured to disperse all or a part of the incident light.

In the display device, the quantum dot sheet may further include a filter configured to filter a part of the light emitted from the quantum dot converter.

The filter may include a blue light cut-off filter configured to filter blue-based light from the light emitted from the quantum dot converter.

The light of the predetermined color may include blue-based light, and the quantum dot converter may include at least one of: at least one red light quantum dot element configured to convert the blue-based light and emit red light, and at least one green light quantum dot element configured to convert the blue-based light and emit green light.

The display device may further include a substrate on which the quantum dot converter and the light transmitter are disposed, and the at least one red light quantum dot element, the at least one green light quantum dot element, and the light transmitter may be disposed in a predetermined pattern.

The light source may further include a light emitter configured to emit light; and at least one light converter configured to absorb a part of the light of the predetermined color emitted from the light emitter and to emit light of a different color.

The light emitter may emit blue-based light, and the light converter may include a second green light converting element configured to convert the blue-based light into green-based light.

The second green light converting element may include at least one of a green quantum dot particle and a green fluorescent particle.

In accordance with still another example of the disclosure, a display device includes at least one light source; and a quantum dot sheet including: a quantum dot converter configured to convert light of a predetermined color emitted from the light source into light of a different color using a quantum dot element and to emit the converted light; and a light transmitter configured to transmit a part of the light emitted from the light source, wherein the at least one light source includes a light emitter main body; a light emitter embedded in the light emitter main body and configured to emit light; and at least one light converter configured to absorb a part of the light of the predetermined color emitted from the light emitter and emit light of a different color.

The light emitter may emit blue-based light, and the at least one light converter may include a second green light converting unit or particle embedded in the light emitter main body. The second green light converting element may include at least one of a green quantum dot particle and a green fluorescent particle.

BRIEF DESCRIPTION OF THE DRAWINGS

These and/or other aspects of the disclosure will become apparent and more readily appreciated from the following detailed description, taken in conjunction with the accompanying drawings, in which like reference numerals refer to like elements, and wherein:

FIG. 8C is a table illustrating an example of locations of red, green, and blue colors in the color gamut of FIG. 8A;

FIG. 10 is a table illustrating an example of locations of red, green, and blue colors in the color gamut of FIG. 9A;

FIG. 18 is a view illustrating an example blue light emitting diode illumination lamp as;

DETAILED DESCRIPTION

Figure 1:
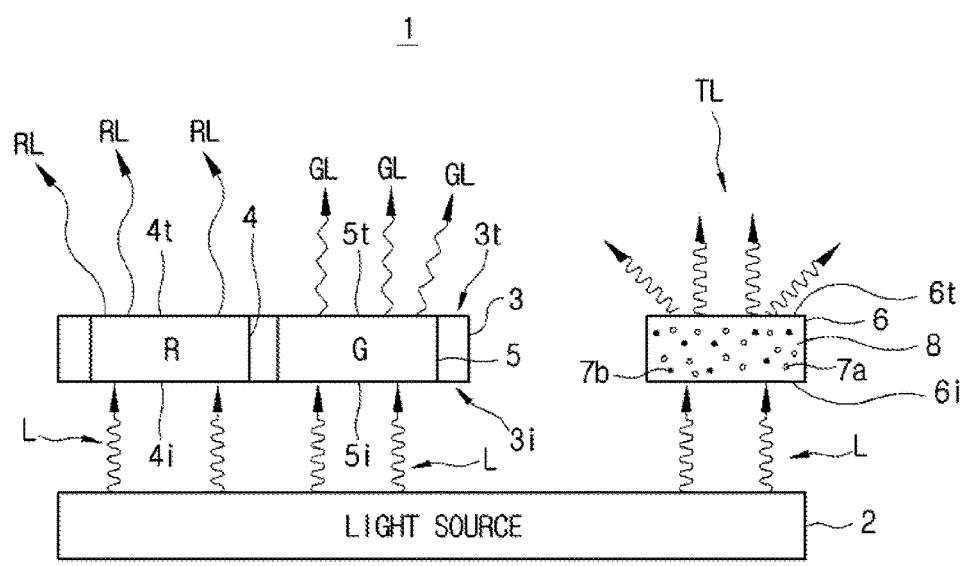
FIG. 1 is a view illustrating an example quantum dot converter and a light transmitter used in a display panel of a display assembly.

Reference will now be made in to the examples of the disclosure, examples of which are illustrated in the accompanying drawings, wherein like reference numerals refer to like elements throughout.

Hereinafter, an example of a display panel will be described with reference to FIGS. 1 to 13.

Figure 2:
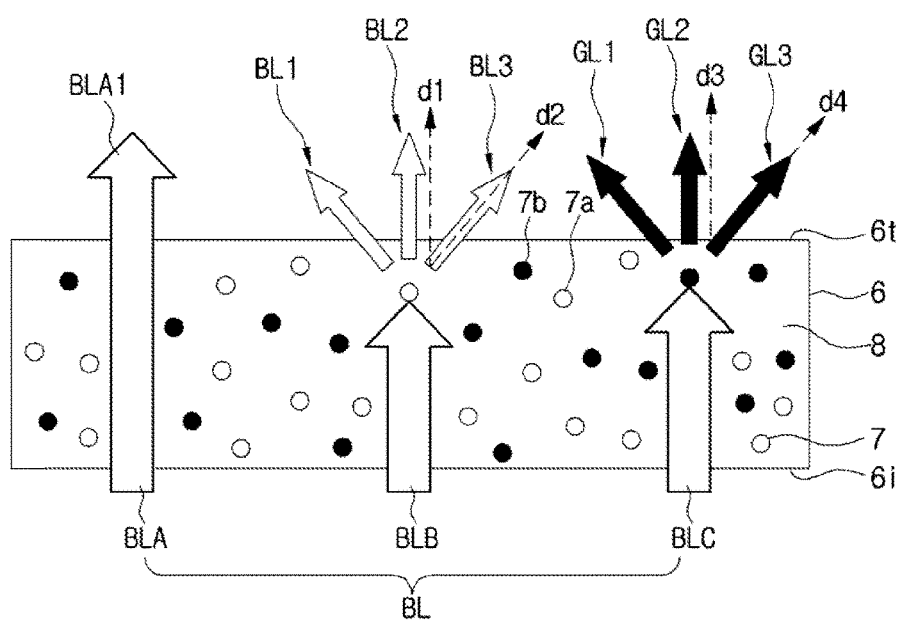
FIG. 2 is a view illustrating an example light transmitter.

FIG. 1 is a view illustrating an example operating principle of a quantum dot converter and an example light transmitter used in a display panel of a display assembly, and FIG. 2 is a view illustrating the example light transmitter.

Referring to FIGS. 1 and 2, a display assembly 1 may include a light source 2, a quantum dot converter 3, and a light transmitter 6, and the quantum dot converter 3 and the light transmitter 6 are used, for example, in a display panel. Meanwhile, light emitted from the external light source 2 is incident onto the quantum dot converter 3 and the light transmitter 6. As described herein, the quantum dot converter and light transmitter may, for example, be embodied in the form of a thin sheet, plate (e.g., a flexible or rigid film or layer), or the like. For ease and convenience of explanation, the terms converter and transmitter are used herein, and the structures thereof will be understood by those skilled in the art as including a thin sheet, plate (e.g., a flexible or rigid film or layer), or the like.

The light source 2 may emit light L, and the emitted light L may be transmitted to the quantum dot converter 3 and/or the light transmitter 6. In the example, the light source 2 may, for example, emit blue-based light. In this case, the blue-based light may, for example, be partially biased to a green color. The light source 2 will be described below.

The quantum dot converter 3 may change a color of the light L emitted from the light source 2 and incident in an incident direction, and emit light RL and GL of different colors in a direction opposite the incident direction. For example, the quantum dot converter 3 may convert blue light BL emitted from the light source 2 and incident on the quantum dot converter 3 into red light RL or green light GL, which is then emitted to the outside. For example, the quantum dot converter 3 may change the wavelength of the incident light, and emit light having a different color from that of the incident light (e.g., wavelength shift).

The quantum dot converter 3 may, for example, change a color of the light L emitted from the light source 2 using quantum dots (QD).

Quantum dot refers to semiconductor crystals formed by the aggregation of hundreds to thousands of atoms. A size of the quantum dot may, for example, be in a range of several nanometers to tens of nanometers. Thus, the quantum dot generates a quantum confinement effect because of a very small size thereof. In the quantum confinement effect, when the particles are very small, electrons in a particle form a discrete energy state by an outer surface of the particle, and as the size of a space in the particle is small, an energy state of the electron is relatively increased and a bandgap is widened. In the quantum dot, based on the above quantum dot confinement effect, when light such as ultraviolet light, visible light, or the like is incident, light having wavelengths of various ranges may be generated. In this case, the quantum dot disperses and emits the incident light.

A length of a wavelength of light generated from quantum dots may be depending on a size of a particle. For example, when light has a wavelength having a greater energy than bandgap energy is incident onto the quantum dot, the quantum dot absorbs energy of the light and is excited, and then emits light having a predetermined wavelength, and thus, becomes a ground state. In this case, when the size of the quantum dot is small, light having a relatively short wavelength such as blue-based light or green-based light may be generated, and when the size of the quantum dot is large, light having a relatively long wavelength such as red-based light may be generated. Thus, light of various colors may be realized based on sizes of the quantum dots.

Hereinafter, a quantum dot particle capable of emitting the green-based light based on incident light is referred to as a green quantum dot particle, and a quantum dot particle capable of emitting the red-based light based on incident light is referred to as a red quantum dot particle. The green quantum dot particle may, for example, be a particle having a width in a range of 2 nm to 3 nm, and the red quantum dot particle may, for example, be a particle having a width in a range of 5 nm to 6 nm.

The quantum dot converter 3 may include a plurality of quantum dots, and the plurality of quantum dots may emit light of various colors based on sizes thereof. Thus, the quantum dot converter 3 may convert incident light using the quantum dot, and emit light of different colors.

The quantum dot converter 3 may be in the form of a thin sheet or plate and include one surface 3i (hereinafter, referred to as a first incident surface) on which the light such as blue light BL radiated from the light source is incident and another surface 3t (hereinafter, referred to as a first emitting surface) from which the light RL and GL having the converted colors are emitted. The first incident surface 3i is disposed in a direction in which the light source 2 is disposed, and the first emitting surface 3t is disposed in a direction opposite the light source 2.

The first emitting surface 3t may be designed to have a greater area than a second emitting surface 6t through which light is emitted from the light transmitter 6. Thus, when an amount of light emitting per unit area is the same, the first emitting surface 3t emits a greater amount of light than the second emitting surface 6t of the light transmitter 6. When the first emitting surface 3t is provided to have a greater area than the second emitting surface 6t, the first incident surface 3i may also be provided to have a greater area than the second incident surface 6i.

The first incident surface 3i of the quantum dot converter 3 may, for example, include a third incident surface 4i and a fourth incident surface 5i onto which light radiated from the light source 2, for example, blue-based light is respectively incident, and the first emitting surface 3t may include a third emitting surface 4t from which red-based light is emitted, and a fourth emitting surface 5t from which green-based light is emitted.

In some examples, a filter 16e (shown in FIG. 13) may be further installed on the first emitting surface 3t. The filter 16e will be described below.

The quantum dot converter 3 may include at least one red light quantum dot unit 4 and at least one green light quantum dot unit 5.

The red light quantum dot unit 4, which, as part of the quantum dot converter, may, for example, be in the form of a thin sheet or plate, emits red-based light RL based on a quantum isolation effect. The red light quantum dot unit 4 is, for example, formed to include a plurality of red quantum dot particles, and a size of the red quantum dot particle in the red light quantum dot unit 4 is, for example, provided to be relatively greater than a size of the green quantum dot particle in the green light quantum dot unit 5.

The green light quantum dot unit 5, which, as part of the quantum dot converter, may, for example, be in the form of a thin sheet or plate, emits green-based light GL having a wavelength greater than the incident blue-based light BL.

The green light quantum dot unit 5 is, for example, formed to include a plurality of green quantum dot particles, and a size of the green quantum dot particle is, for example, provided to be relatively smaller than a size of the red quantum dot particle in the red light quantum dot unit 4.

The red light quantum dot unit 4 and the green light quantum dot unit 5 may have a thin plate shape having a predetermined thickness, and may be provided to be disposed on a substrate or the like based on an arbitrarily or previously determined pattern. In this case, the red light quantum dot unit 4 may include the third incident surface 4i onto which light radiated from the light source 2, for example, the blue light BL is incident and the third emitting surface 4t from which the converted red light RL is emitted. Similarly, the green light quantum dot unit 5 may include the fourth incident surface 5i onto which light radiated from the light source 2, for example, the blue light BL is incident and the fourth emitting surface 5t from which the green light GL is emitted.

In an example, an area of the third emitting surface 4t may be equal to or greater than that of the second emitting surface 6t through which light is emitted from the light transmitter 6. Similarly, an area of the third incident surface 4i may be equal to or greater than that of the second incident surface 6i on which the light BL is incident on the light transmitter 6. In an example, in a similar manner, an area of the fourth emitting surface 5t may be equal to or greater than that of the second emitting surface 6t through which the light is emitted from the light transmitter 6, and in a similar manner, an area of the fourth incident surface 5i may be equal to or greater than that of the second incident surface 6i. Also, both areas of the third emitting surface 4t and the fourth emitting surface 5t may, for example, be greater than the area of the second emitting surface 6t.

When the area of the third incident surface 4i and the area of the fourth incident surface 5i are greater than the area of the second incident surface 6i, a greater amount of light BL may be incident onto the third incident surface 4i and the fourth incident surface 5i than onto the second incident surface 6i, and also, when the area of the third emitting surface 4t and the area of the fourth emitting surface 5t are greater than that of the second emitting surface 6t, a greater amount of light (RL and GL) may be emitted from the third emitting surface 4t and the fourth emitting surface 5t than from the second emitting surface 6t. Thus, when the area of the third incident surface 4i and the area of the fourth incident surface 5i are greater than that of the second incident surface 6i, or the area of the third emitting surface 4t and the area of the fourth emitting surface 5t are greater than that of the second emitting surface 6t, an amount of the light RL and GL incident onto or emitted from the red light quantum dot unit 4 or the green light quantum dot unit 5 is greater than an amount of the light TL emitted from the light transmitter 6, and thus, a ratio of the emitted red-based light RL, the green-based light GL, and the blue-based light TL may be equal to or similar to each other.

The red light quantum dot unit 4 and the green light quantum dot unit 5 may be disposed adjacent to each other, and in this case, side surfaces of the red light quantum dot unit 4 and the green light quantum dot unit 5 may contact each other, or may be spaced apart from each other by a predetermined distance. When the side surfaces of the red light quantum dot unit 4 and the green light quantum dot unit 5 are spaced apart from each other, a predetermined material may be inserted between the red light quantum dot unit 4 and the green light quantum dot unit 5, thereby reducing and/or preventing an interference therebetween.

Meanwhile, since the light is dispersed in the quantum dot converter 3, the red light quantum dot unit 4 and the green light quantum dot unit 5 disperse and emit the red light RL and the green GL in various directions.

In an example, a filter 16e (shown in FIG. 13) configured to filter a part of the emitted light may be further provided on the third emitting surface 4t and the fourth emitting surface 5t of the red light quantum dot unit 4 and the green light quantum dot unit 5.

In an example, the filter 16e may filter the blue-based light. Colors of the blue-based light incident onto the red light quantum dot unit 4 and the green light quantum dot unit 5 are generally changed by the quantum dots and emitted, but a part of the blue-based light may pass through and/or be emitted from the red light quantum dot unit 4 and the green light quantum dot unit 5 without contacting the quantum dots, and the filter 16e may filter the blue-based light emitted from the red light quantum dot unit 4 and the green light quantum dot unit 5, and thus, suitable red-based light and green-based light may be emitted. When the filter 16e filters the blue-based light, the filter 16e may include a blue light cut-off filter (BCF). The filter 16e may be omitted.

The light transmitter 6 transmits light incident from the light source 2 in a direction opposite an incident direction. In this case, in the light transmitter 6, as described in FIG. 2, a part of the incident light L is directly transmitted (BLA1), or is dispersed and transmitted (BL1 to BL3), or converted into light GL1 to GL3 of different colors and then emitted. When the light incident from the light source 2 is the blue-based light BL, the light transmitter 6 may emit blue light BLA1 and BL1 to BL3 having the same color as the incident light together with light having a different color such as green-based light GL1 to GL3.

The light transmitter 6 may, for example, be realized in a thin plate having a predetermined thickness similarly to the red light quantum dot unit 4 and the green light quantum dot unit 5, and light is incident onto one surface (6i, hereinafter, referred to as a second incident surface) of a thin plate, and light is emitted from the other surface 6t (hereinafter, referred to as a second emitting surface) of the thin plate.

As described in FIG. 2, the light transmitter 6 may include a main body 8, at least one dispersion particle 7a dispersed in the main body 8, and at least one light converting unit 7b comprising a light converting element dispersed in the main body 8 and converting the light BL of a predetermined color into light of a different color.

The main body 8 may be provided with a light transmitting material capable of transmitting all or a part of incident light. The light transmitting material may include a material having a transparency equal to or more than a predetermined level such as a resin including a natural resin, a synthetic resin, or the like, or glass or the like. The synthetic resin may include an epoxy resin, a urethane resin, polymethyl methacrylate (PMMA), or the like, and the glass may include silicate glass, borate glass, phosphate glass, or the like. Additionally, various materials capable of transmitting various types of light considered by a designer may be used as the light transmitting material.

Light of a predetermined color such as the blue-based light BL may be incident onto the main body 8 through the incident surface 6*i*, and then, emitted to the outside through the second emitting surface 6*t*.

A part BLA of the light BL incident onto the main body 8 may not encounter the dispersion particle 7*a* and the light converting unit or particle 7*b*, pass through the main body 8, and be emitted without a change of direction or color through the second emitting surface 6*t* (BLA1). Also, other parts BLB and BLC of the light BL incident onto the main body 8 may be dispersed or color-changed by any one of the dispersion particle 7*a* and the light converting unit 7*b*, and then emitted (BL1 to BL3 and GL1 to GL3).

The dispersion particles 7*a* may be disposed in the main body 8 in a random or predetermined pattern, and disperse incident light in a predetermined range. For example, the dispersion particle 7*a* may disperse the incident blue-based light BLB. A part BLA of the incident blue-based light BL contacts the dispersion particle 7*a* and is dispersed and emitted. Thus, a part BLB of the light BL incident onto the light transmitter 6 is dispersed in a predetermined range, and passes through the light transmitter 6 (BL1 to BL3).

In an example, the dispersion particle 7*a* may include at least one of zinc oxide ($Zn_xO_x$), titanium oxide ($Ti_xO_x$), and silicon oxide ($Si_xO_x$), and particles of various types capable of dispersing incident light may also be adopted as the above dispersion particle 7*a*.

Since a part BLB of the incident light BL due to the dispersion particle 7*a* is dispersed and emitted (BL1 to BL3), the light passed through the light transmitter 6 may be dispersed and emitted in a range equal to or similar to that of the light RL and GL emitted from the red light quantum dot unit 4 and the green light quantum dot unit 5.

When the blue-based light BL passes through the light transmitter 6, since the incident blue light BL is diffused and emitted more than in a case in which the dispersion particle 7*a* is not present, the blue light BL may be emitted in a forward direction d1 as well as an oblique direction d2. The range in which the blue-based light BLB is dispersed may be different based on types of the dispersion particle 7*a*, or the like. Thus, since the blue-based light BLB is dispersed by the dispersion particle 7*a*, a disadvantageous color viewing angle which may be caused by smaller dispersion of the blue-based light than light of other colors may be reduced.

The light converting units or particles 7*b* are disposed in the main body 8 in a random or predetermined pattern, and change the color of the incident light, which can then be emitted. For example, when the incident light is the blue-based light BL, the blue-based light BL may be converted into the green-based light GL or the red-based light RL and emitted.

The light converting unit 7*b*, for example, may include a green light converting unit which converts the blue-based light BLC into the green-based light GL.

In an example, the green light converting unit may include at least one of a green quantum dot particle and a green fluorescent particle. For example, in the main body 8, only green quantum dot particles may be disposed, or only green fluorescent particles may be disposed, or both the green quantum dot particles and the green fluorescent particles may be disposed. When the green quantum dot particles and the green fluorescent particles are both disposed in the main body 8, both may be included in the same ratio, or in a different ratio.

The green quantum dot particle may, for example, be a semiconductor crystal having the above described size of 2 nm to 3 nm.

Since the green fluorescent particle changes a wavelength of incident light, light of a predetermined color may be converted into green-based light. For example, the green fluorescent particle may convert the blue-based light BLC into the green-based light GL1 to GL3.

The green fluorescent particle may disperse and emit the incident light BLC. In this case, after the incident blue-based light BLC is converted into the green-based light GL1 to GL3, the green-based light GL1 to GL3 may be emitted in a forward direction d3 as well as an oblique direction d4.

The green fluorescent particle may be a particle having a width of several nanometers to tens of nanometers, and may be various inorganic fluorescent materials (for example, ZnS(Ag), or the like) realized using zinc sulfide, cadmium sulfide, or the like. Additionally, for example, means of various types capable of emitting the green-based light by changing the wavelength of the blue-based light may be used as a green fluorescent particle.

In an example, the green fluorescent particle may include a green fluorescent material having a peak of 540 nm or less.

When the green light converting unit is provided in the main body 8 of the light transmitter 6 onto which the blue-based light BL is incident, a wavelength of a part of blue-based light passed through the light transmitter 6 is changed, and becomes the green-based light GL1 to GL3. Thus, in the light transmitter 6, since an emitted light is a mixture of the blue-based light BLA1, BL1 to BL3 and the green-based light GL1 to GL3 which are passed through the main body 8, the emitted blue-based light TL has an added green color compared with a case in which the green light converting unit does not exist. Thus, when the incident blue-based light BL is more turbid than the original blue, the blue-based light TL more close to a primary color may be emitted from the light transmitter 6.

The dispersion particles 7*a* and the light converting units or particles 7*b* may be distributed in the main body 8 in nearly the same ratio, or distributed in a different ratio. In other words, the dispersion particles 7*a* and the light converting units or particles 7*b* may be included in the main body 8 in nearly the same ratio, or the dispersion particles 7*a* may be included in a greater amount than the light converting units or particles 7*b*, or in contrast, the light converting units or particles 7*b* may be included in a greater amount than the dispersion particles 7*a*.

When the dispersion particles 7*a* and the light converting units or particles 7*b* are manufactured by curing the main body 8 such as an epoxy resin, or the like in a liquid state, the dispersion particles 7*a* and the light converting units or particles 7*b* may be injected into the main body 8 and distributed in the main body 8, and the dispersion particles 7*a* and the light converting units or particles 7*b* may be injected into the main body 8 before curing the main body 8 or during a process of curing the main body 8.

A small amount of the dispersing particles 7*a* and light converting units or particles 7*b* may be included in the main body 8, but the amount of the dispersion particles 7*a* and the light converting units or particles 7*b* included in the main body 8 may be changed by arbitrary selection of a designer. For example, when light BLB of the incident light BL is desired to be dispersed more, the designer may inject more dispersion particles 7*a* into the main body 8. Also, when the blue-based light BL is incident, and more amount of the green-based light GL1 to GL3 are desired to be emitted, the designer may inject more light converting units or particles 7*b* into the main body 8.

The dispersion particles 7*a* and the light converting units or particles 7*b* may be omitted. For example, when a light converter 2*d* is provided in the light source 2, the light converting units or particles 7*b* may be omitted.

The quantum dot converter 3 and the light transmitter 6, more particularly, the red light quantum dot unit 4, the green light quantum dot unit 5, and the light transmitter 6 may be disposed on the same plane in the display panel, and they may be formed in one thin plate shape. In order to stably and fixedly dispose the red light quantum dot unit 4, the green light quantum dot unit 5, and the light transmitter 6, the red light quantum dot unit 4, the green light quantum dot unit 5, and the light transmitter 6 may be installed on a predetermined substrate. The substrate may be formed of a transparent material, and thus, may transmit the light emitted from the red light quantum dot unit 4, the green light quantum dot unit 5, and the light transmitter 6. For example, the substrate may be formed of a transparent material such as poly methyl methacrylate resin.

The light source 2 generates light, and radiates the light onto the quantum dot converter 3 and the light transmitter 6. The light source 2 may generate light having intensity and luminance corresponding to electric power applied from the outside, and radiate the light onto the quantum dot converter 3 and the light transmitter 6. The light generated from the light source 2 may be reflected from an additional reflective plate (not shown), an aperture (not shown), or the like, and may be radiated in a direction toward the quantum dot converter 3 and the light transmitter 6.

Figure 3:
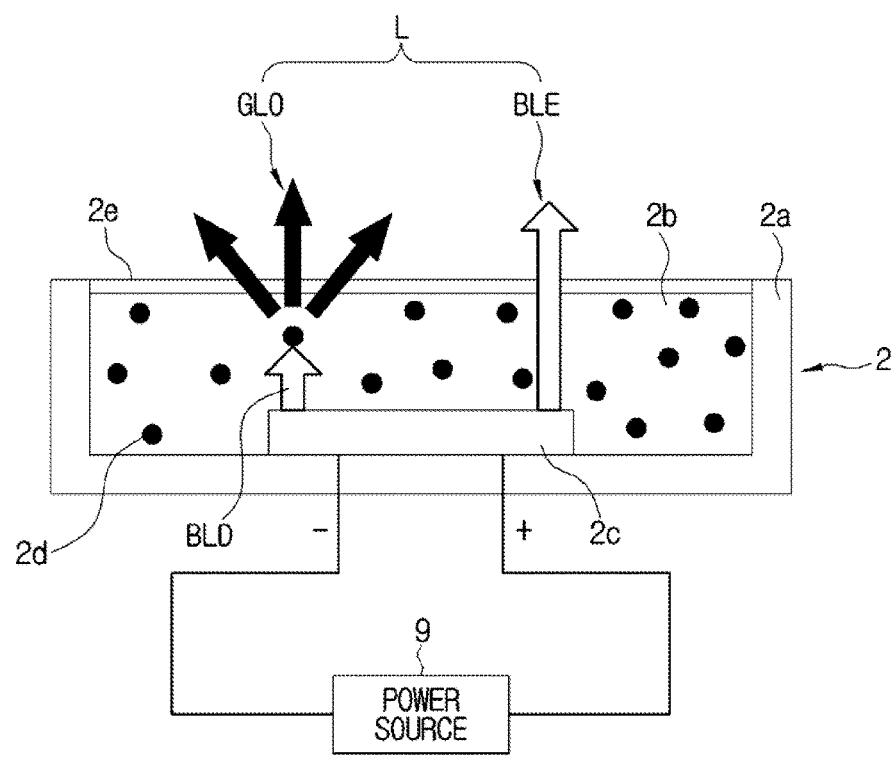
FIG. 3 is a view illustrating an example of an external light source.
Figure 4:
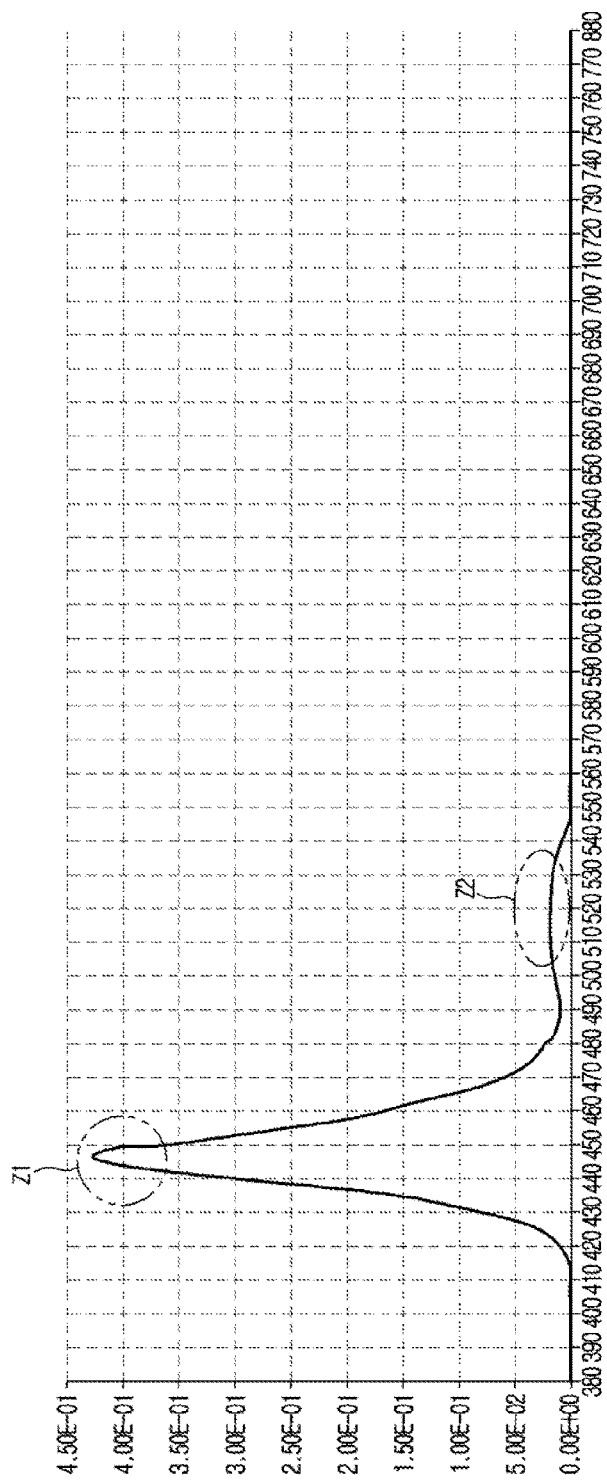
FIG. 4 is a graph illustrating a relationship between intensity and wavelength of light emitted from a light source.

FIG. 3 is a view illustrating an example of an external light source, and FIG. 4 is a graph illustrating an example relationship between intensity and wavelength of light emitted from a light source. In FIG. 4, a y-axis represents the intensity of the light, and an x-axis represents the wavelength of the light.

The light source 2 may generate light of a predetermined color, and may generate blue-based light BL in an example. The blue-based light BL represents light having a wavelength relatively shorter than red-based light or green-based light, and has a wavelength of 400 nm to 500 nm. The blue-based light BL incident onto the quantum dot converter 3 is converted into the red-based light RL or the green-based light GL, and is emitted to the outside. The blue light BL incident onto the light transmitter 6 may be transmitted through the light transmitter, dispersed in the light transmitter 6, or converted into the green-based light, and then, emitted.

The display assembly 1 may include only one light source 2 or a plurality of light sources 2, and when the display assembly 1 includes a plurality of light sources 2, the light sources 2 may be provided in each of the red light quantum dot unit 4 and the green light quantum dot unit 5 of the quantum dot converter 3, and the light transmitter 6. In this case, the light sources 2 corresponding to the number of the red light quantum dot unit 4, the green light quantum dot unit 5, and the light transmitter 6 may be provided in the display assembly 1.

The light source 2 may, for example, be realized using a light bulb, a halogen lamp, a fluorescent lamp, a sodium lamp, a mercury lamp, a fluorescent mercury lamp, a xenon lamp, an arc illumination lamp, a neon tube lamp, an electroluminescent (EL) lamp, a light emitting diode (LED) lamp, a cold cathode fluorescent lamp (CCFL), an external electrode fluorescent lamp (EEFL), or the like, and additionally, various illumination devices configured to generate light of a predetermined color such as a blue color may be used as the light source 2.

Referring to FIG. 3, the light source 2 may include a housing 2a, an inner space 2b, a light emitter 2c, a light converter 2d, and a light emitter 2e.

The housing 2a is provided to form an exterior of the light source 2, has the inner space 2b therein, and includes the light emitter 2c in the inner space 2b. For example, the housing 2a includes an outer wall frame and a bottom frame which form the inner space 2b, and the light emitter 2c may be formed on one surface of the bottom frame toward the inner space 2b. Various cables or circuits configured to supply electric power to the light emitter 2c may be provided on one surface or an opposite surface in a direction toward the inner space 2b of the lower frame. The housing 2a blocks leakage of incident light toward the outside, and the light emitted from the light emitter 2c or the light converted by the light converter 2d are emitted only in a predetermined direction.

The inner space 2b is provided to be formed by the housing 2a and the light emitter 2e, and air, particles, or the like related to generation of the light or conversion of the light float therein. At least one light converter 2d floats in the inner space 2b.

The light emitter 2c may generate and emit light BLD of a predetermined color based on the electric power supplied from the external power source 9. The light emitter 2c may be realized using an LED. The LED, for example, may include a blue LED, and in this case, the light emitter 2c may emit the blue-based light BLD.

The light converter 2d changes color of a part of the light BLD emitted from the light emitter 2c and emits green-based light GL0

In an example, when the blue-based light BLD is emitted from the light emitter 2c, the light converter 2d may convert the blue-based light BLD into green-based light and emit it. For example, the light converter 2d may change a wavelength of the light BLD emitted from the light emitter 2c, and for example, the wavelength of the emitted light BLD may be changed to be increased.

In this case, the light converter 2d may include a green light converting unit or particle configured to convert the blue-based light BLD into the green-based light GL0.

Here, the green light converting unit may include at least one of a green quantum dot particle and a green fluorescent particle. The green quantum dot particle, as described above, refers to a semiconductor crystal having a size of, for example, 2 nm to 3 nm, and the green fluorescent particle changes a wavelength of the incident light to convert the light of a predetermined color into the green-based light. In an example, the green fluorescent particle may include a green fluorescent material having a peak of 540 nm or less. The green quantum dot particle or the green fluorescent particle may have a droplet shape.

When the blue-based light BLD is emitted from the light emitter 2c, a part of the blue-based light BLD may be converted into the green-based light GL0 by the light converter 2d and emitted to the outside, or may be emitted to the outside without a change of the color (BLE). Thus, the light emitter 2c may emit the blue-based light BLE and the green-based light GL0, and the emitted blue-based light BLE and the emitted green-based light GL0 are mixed.

Thus, as illustrated, for example, in FIG. 4, the light L emitted from the light source 2, according to the graph, may include a first area Z1 displayed by the light BLE which is emitted by the light emitter 2c of the blue light emitting diode and whose wavelength is not changed and a second area Z2 displayed by the green-based light GL0 which has been converted by the light converter 2d. In this case, an intensity of light in the second area Z2 may be changed based on a distribution amount of the light converters 2d. For example, when the light converters 2d are provided in the inner space 2*b* in a larger amount, the intensity of the light in the second area Z2 is greatly increased, and is more protruded in the second area Z2 in the graph. In contrast, when the light converters 2*d* are provided in the inner space 2*b* in a smaller amount, the intensity of the light in the second area Z2 is more decreased, and has a flatter shape in the second area Z2 in the graph. Thus, the designer may control the color of the emitted light L by changing the amount of the light converters 2*d*. As described in FIG. 4, the light L emitted from the light source 2 may have a greater intensity in the blue-based light than the green-based light.

Since the light source 2 may emit the light L closer to the green color than the blue-based light emitted from a blue light emitting diode, although more turbid blue light is emitted from the blue light emitting diode, originally desired blue-based light or light similar to a blue color may be emitted.

When the blue-based light L mixed with the green-based light is emitted from the light source 2, the light converting unit or particle 7*b* in the light transmitter 6 such as the green quantum dot particle or the green fluorescent particle may be omitted. For example, since the light source 2 emits the blue-based light mixed with the green-based light, the light incident onto the light transmitter 6 may be the blue-based light mixed with the green-based light, and thus, the blue-based light TL added with a green color may be emitted without a change of the color of the incident light L. Also, in some examples, although the blue-based light L mixed with the green-based light is emitted from the light source 2, the light converting unit or particle 7*b* may be provided in the light transmitter 6. In this case, the light converting unit or particle 7*b* in the light transmitter 6 mixes a greater amount of green-based light with the blue-based light L in which the incident green-based light is mixed, and emits the mixed light (TL). Thus, although the blue-based light BLD and BLE emitted from the blue light emitting diode which is the light emitter 2*c* is more turbid than the original blue color, the blue-based light TL more close to the primary color in the light transmitter 6 may be emitted by the light converter 2*d* in the light source 2 and the light converting unit or particle 7*b* in the light transmitter 6.

In some examples, the light converter 2*d* may be omitted. For example, when the light converting unit or particle 7*b* is provided in the light transmitter 6, the light source 2 may not include the light converter 2*d*.

The light emitter 2*e* may be installed in the housing 2*a*, and may form an inner space 2*b* with the housing 2*a*. The light emitter 2*e*, for example, may be installed on an outer wall of the housing 2*a*, etc. The light emitter 2*e* may emit light emitted from the light emitter 2*c* and the light converted by the light converter 2*d* in a predetermined direction. The light emitter 2*e* may be formed of a transparent material through which light is transmitted. The transparent material, for example, may be realized using glass or a synthetic resin an acrylic resin. Also, the light emitter 2*e* may be realized using various transparent materials which may be considered by the designer.

In FIG. 3, the example including the light emitter 2*e* having a planar shape is illustrated, but the shape of the light emitter 2*e* is not limited thereto, and may have various shapes such as a semicircle, a cylinder, a triangular pyramid, a cylinder having a semispherical shaped head, or the like which may be considered by the designer.

A display panel including the above quantum dot converter and the light transmitter will be described.

Figure 5:
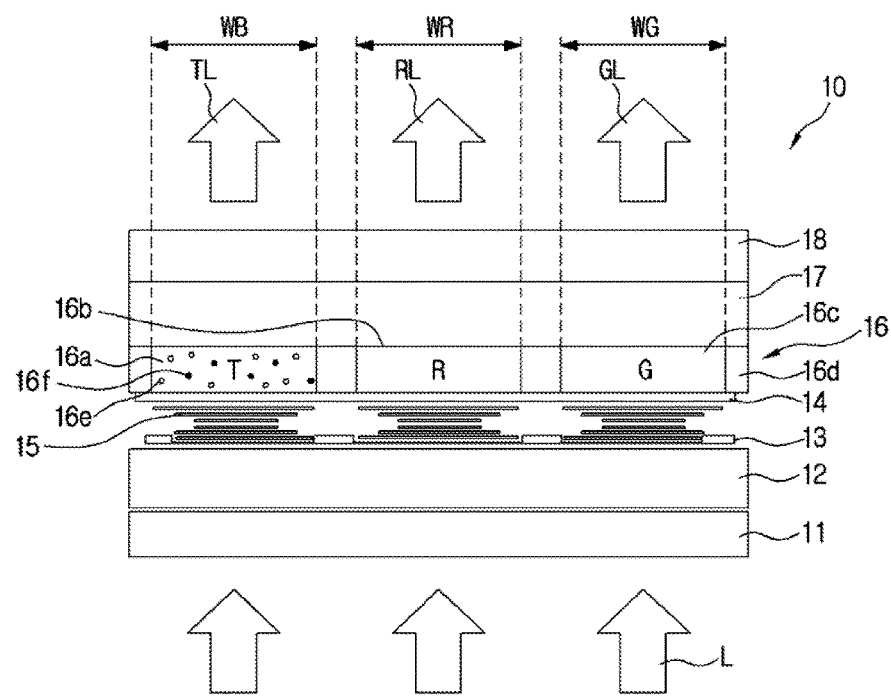
FIG. 5 is a side cross-sectional view illustrating an example of a display panel.
Figure 6:
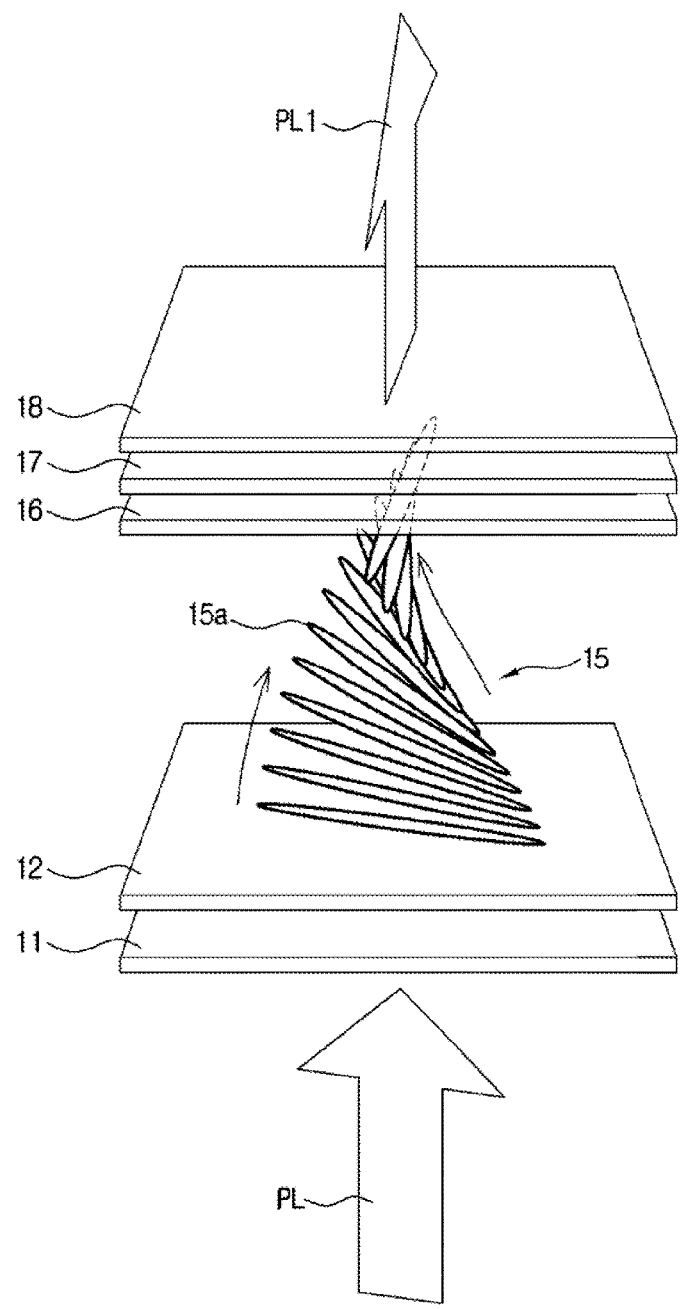
FIG. 6 is a view illustrating blocking of light based on an arrangement of liquid crystals in a liquid crystal layer.
Figure 7:
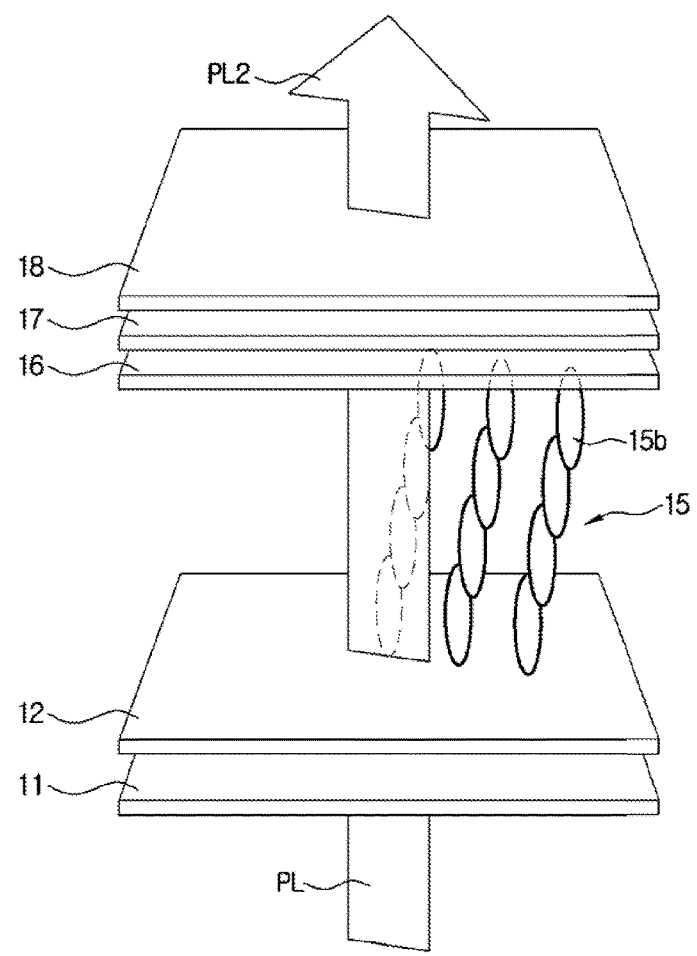
FIG. 7 is a view illustrating transmission of light based on an arrangement of liquid crystals in a liquid crystal layer.

FIG. 5 is a side cross-sectional view illustrating an example of a display panel. FIG. 6 is a view illustrating blocking of light based on an arrangement of liquid crystals in a liquid crystal layer, and FIG. 7 is a view illustrating transmission of light based on an arrangement of liquid crystals in a liquid crystal layer. For convenience of descriptions, in FIGS. 5 to 7, upward directions of the drawings will be referred to as forward directions, and downward directions of the drawings will be referred to as rearward directions.

As described in FIGS. 5 to 7, a display panel 10 may include a first polarizing filter 11, a first substrate 12, a first electrode 13, a second electrode 14, a liquid crystal layer 15, a quantum dot sheet 16, a second substrate 17, and a second polarizing filter 18.

The first polarizing filter 11 may polarize light L incident from an external light source, and transmit light only vibrating in a direction the same as a polarizing axis to the first substrate 12. The first polarizing filter 11, as described in FIGS. 5 to 7, may be provided to have a rear surface facing a light source and a front surface in contact with the rear surface of the first substrate 12 or adjacent thereto. The first polarizing filter 11 may be formed in a film shape. In an example, the first polarizing filter 11 may be a vertical polarizing filter or a horizontal polarizing filter.

The first electrode 13 may be installed on a front surface of the first substrate 12, and the first polarizing filter 11 may be installed on a rear surface of the first substrate 12. The first substrate 12 may be formed of a transparent material to transmit the light incident in the rearward direction, and for example, may be realized in a synthetic resin such as an acrylic, glass, or the like. In an example, the first substrate 12 may include a flexible printed circuit board (FPCB).

The first electrode 13 installed on the first substrate 12 applies a current to the liquid crystal layer 15 based on an applied electric power along with the second electrode 14, and thus as described in FIGS. 6 and 7, may adjust arrangement of liquid crystal molecules 15*a* and 15*b* in the liquid crystal layer 15. Therefore, based on the arrangement of the liquid crystal molecules 15*a* and 15*b*, a vibration direction of the light PL polarized by the first polarizing filter 11 may be changed or not changed.

In an example, the first electrode 13 may be realized using a thin film transistor (TFT). The first electrode 13 may be connected to the external power source to receive electric power. The first electrodes 13 may be installed in plural number on the first substrate 12, and the first electrode 13 may be installed on the first substrate 12 in a predetermined pattern. Each of the first electrodes 13 may be installed on the first substrate 12 corresponding to each of liquid crystal molecules 15*a* and 15*b* in the liquid crystal layer 15.

The second electrode 14 is provided to correspond the first electrode 13 with respect to the liquid crystal layer 15, and applies a current to a liquid crystal layer 15 along with the first electrode 13. One surface of the second electrode 14 is provided to contact the quantum dot sheet 16, and the other surface of the second electrode 14 is provided to contact the liquid crystal layer 15. The second electrode 14 may be realized as a common electrode.

The liquid crystal layer 15 is provided between the second electrode 14 and the first electrode 13, and a plurality of liquid crystal molecules are disposed in the liquid crystal layer 15.

A liquid crystal is a material in a middle state between a liquid state and a crystal state, and may include a plurality of liquid crystal molecules 15*a* and 15*b*. The liquid crystal molecules 15*a* and 15*b* may be arranged in a plurality of rows in the liquid crystal layer 15. The liquid crystal layer 15 may directly transmit or change a vibration direction and then transmit light polarized by the first polarizing filter 11 based on alignment of the liquid crystal molecules 15a and 15b.

For example, the liquid crystal molecules in the liquid crystal layer 15 may be arranged in different shapes or orientations based on electric power applied between the second electrode 14 and the first electrode 13.

When an electrical field is not generated, the liquid crystal molecule 15a may be twisted and arranged in a spiral shape as shown in FIG. 6. In this case, the liquid crystal molecule 15a may be aligned in the spiral shape in a direction perpendicular to a line segment connected with the first electrode 13 or the second electrode 14. When the liquid crystal molecule 15a is twisted and aligned in the above shape, a vibration direction of the polarized light PL incident onto the liquid crystal layer 15 is twisted by about 90 degrees (PL1). That is, the vibration direction of the polarized light is changed.

In contrast, when the electrical field is generated by the first electrode 13 and the second electrode 14, the liquid crystal molecule 15b may be aligned and arranged in a direction parallel with the line segment connecting the first electrode 13 with the second electrode 14 as shown in FIG. 7 based on the generated electrical field. In this case, the vibration direction of the polarized light PL is not changed, and the light directly passes through the liquid crystal layer 15 (PL2).

In other words, the liquid crystal layer 15 may change or not change the vibration direction of the polarized light based on the application of the electric power to the first electrode 13 and the second electrode 14.

When the first polarizing filter 11 is a vertical polarizing filter, and the second polarizing filter 18 is a horizontal polarizing filter, and when the liquid crystal molecule 15a is twisted and aligned in the spiral shape as shown in FIG. 6, the liquid crystal molecule 15a polarizes the light of the vertical direction passed through the first polarizing filter 11 in the horizontal direction. The light passed through the liquid crystal layer 15 and polarized in the vertical direction may pass through the second polarizing filter 18, and thus, the light incident onto the liquid crystal layer 15 may be displayed by the display panel 10.

When the first polarizing filter 11 is a vertical polarizing filter, and the second polarizing filter 18 is a horizontal polarizing filter, and the liquid crystal molecule 15b is twisted and aligned in the spiral shape as shown in FIG. 7, the liquid crystal layer 15 directly transmits the light polarized by the first polarizing filter 11 in the vertical direction, and thus, the light passed through the liquid crystal layer 15 is blocked by the second polarizing filter 18 which is a horizontal polarizing filter. Thus, the light passed through the liquid crystal layer 15 is not displayed by the display panel 10 to the outside.

The quantum dot sheet 16 may convert incident light having a predetermined color into light of a different color or output without converting into the light of the different color. Thus, the quantum dot sheet 16 may function to display various colors on the display panel 10.

The quantum dot sheet 16 may be provided to have a rear surface adjacent to the second electrode 14 and a front surface on the second substrate 17.

Blue-based light, for example, may be incident onto the quantum dot sheet 16, and the quantum dot sheet 16 may include a light transmitter 16a configured to transmit the incident blue-based light, at least one red light quantum dot unit 16b configured to convert the incident blue-based light and emit red-based light, and at least one green light quantum dot unit 16c configured to convert the incident blue-based light and emit green-based light.

The light transmitter 16a may directly transmit a part of the incident light for emission to the outside, or convert a color of a part of the incident light or disperse a part of the incident light for emission to the outside. For example, the light transmitter 16a, as described in FIGS. 1 and 2, may disperse all or a part of the blue-based light and emit in a forward direction. Also, the light transmitter 16a may convert a part of the incident blue-based light into the green-based light and emit in the forward direction. Thus, the light transmitter 16a may emit a mixed light including the blue-based light and the green-based light in a direction toward the second substrate 17. In this case, green-based light may be also dispersed and emitted in the direction toward the second substrate 17.

For example, the light transmitter 16a, as described in FIGS. 1 and 2, may include a main body, and dispersion particles and converting units distributed in the main body.

The main body may be formed of a light transmitting material, and the light transmission material may include a material having a transparency of a predetermined level or greater, which may include a resin such as a natural resin or a synthetic resin, glass, or the like.

The dispersion particles disperse the incident blue light, and the blue light is emitted in a direction toward the second substrate 17. Thus, the blue light passed through the second polarizing filter 18 and the second substrate 17 and emitted may be viewed in a viewing angle equal to the above described red light and green light or similar thereto. The dispersion particle may include zinc oxide, titanium oxide, silicon oxide, or the like.

The light converting unit may convert a color of the light incident onto the main body and emit the light. For example, when the incident light is blue-based light, the blue-based light may be converted into green-based light or red-based light and emitted.

In an example, the light converting unit may include a green light converting unit configured to convert the blue-based light into the green-based light, and here, the green light converting unit may include at least one of a green quantum dot particle and a green fluorescent particle.

The red light quantum dot unit 16b may change a wavelength of the incident blue-based light using quantum dots, and emit the red-based light having a longer wavelength. The red light quantum dot unit 16b includes a plurality of red quantum dot particles, and a size of the red quantum dot particle in the red light quantum dot unit 16b is provided to be greater than that of the green quantum dot particle in the green light quantum dot unit 16c.

The green light quantum dot unit 16c may change a wavelength of the incident blue-based light using quantum dots, and emit the green-based light having a longer wavelength than the blue-based light. The green light quantum dot unit 16c includes a plurality of green quantum dot particles, and a size of the green quantum dot particle in the green light quantum dot unit 16c is provided to be smaller than that of the red quantum dot particle in the red light quantum dot unit 16b.

The red light quantum dot unit 16b and the green light quantum dot unit 16c may convert the blue-based light transmitted from the liquid crystal layer 15 into the light of the red or green color using the quantum dot, and emit in the direction toward the second substrate 17. In this case, the red light quantum dot unit 16b and the green light quantum dot unit 16c may change, disperse and emit the incident light. Thus, the red-based light or the green-based light passed through the second substrate 17 and the second polarizing filter 18 may be viewed in a relatively wide range.

The red light quantum dot unit 16b or the green light quantum dot unit 16c may have a predetermined size, and for example, may have a sufficient size to convert all amount of the blue-based light passed through the liquid crystal molecules of the liquid crystal layer 15 into the red-based light or the green-based light.

The light transmitter 16a may be provided to be relatively smaller than at least one of the red light quantum dot unit 16b and the green light quantum dot unit 16c, and for example, the light transmitter 16a may be provided to have a relatively smaller width WB than at least one of the red light quantum dot unit 16b and the green light quantum dot unit 16c. For example, at least one of the red light quantum dot unit 16b and the green light quantum dot unit 16c may be provided so that at least one of an incident surface onto which light is incident and an emitting surface from which the light is emitted may be wider than at least one of the incident surface and the emitting surface of the light transmitter 16a. For example, widths WR and WG of the red light quantum dot unit 16b and the green light quantum dot unit 16c may be provided to be relatively greater than the width WB of the light transmitter 16a. Since the red light quantum dot unit 16b and the green light quantum dot unit 16c are provided to be larger than the light transmitter 16a, the red light quantum dot unit 16b and the green light quantum dot unit 16c may emit a greater amount of the red-based light and the green-based light than the light emitted by the light transmitter 16a in the forward direction.

The light transmitter 16a, the red light quantum dot unit 16b, and the green light quantum dot unit 16c, as described in FIG. 5, may be provided to be disposed on a position corresponding to one group of liquid crystal molecules 15a and 15b of the liquid crystal layer 15. For example, liquid crystal molecules of one group are provided to correspond to one of light transmitters 16a, and liquid crystal molecules of another group are provided to correspond to one of the red light quantum dot units 16b, and liquid crystal molecules of still another group are provided to correspond to one of the green light quantum dot units 16c.

Even when the light transmitter 16a is relatively smaller than at least one of the red light quantum dot unit 16b and the green light quantum dot unit 16c, the size of liquid crystal molecules of a corresponding row may be equal to the size of liquid crystal molecules of a row corresponding to at least one of the red light quantum dot unit 16b and the green light quantum dot unit 16c. Thus, a part of the incident blue light may not be transmitted by the light transmitter 16a, but may be blocked by a blocking wall, or the like and may not be emitted in the forward direction. Thus, the blue light passed through the light transmitter 16a may be a relatively smaller amount than at least one of the red light and the green light emitted from at least one of the red light quantum dot unit 16b and the green light quantum dot unit 16c. Thus, as described above, the problem of a higher ratio of the amount of the blue light than the red light or the green light may be solved.

In an example, the red light quantum dot unit 16b and the green light quantum dot unit 16c may be disposed more in the quantum dot sheet 16 than in the light transmitter 16a.

The light transmitter 16a, the red light quantum dot unit 16b, and the green light quantum dot unit 16c may be in contact with each other, or may be spaced apart from each other by a predetermined distance. When the light transmitter 16a, the red light quantum dot unit 16b, and the green light quantum dot unit 16c are spaced apart from each other, a blocking wall including a metal, a synthetic resin, a synthetic rubber, or the like may be provided therebetween.

The quantum dot sheet 16 is installed on one surface of the second substrate 17 in the rearward direction, and the second polarizing filter 18 is installed on one surface of the second substrate 17 in the forward direction. For example, the red light quantum dot unit, the green light quantum dot unit, and the light transmitter may be respectively installed on the second substrate 17 in a predetermined pattern. In this case, the second substrate 17 may be divided into a plurality of unit areas, the red light quantum dot unit, the green light quantum dot unit, and the light transmitter may, for example, be provided to be installed in each unit area in the same pattern and each of the unit areas may operate as one pixel.

The second substrate 17 may be formed of a transparent material, and thus, the red light, the green light, and the blue light emitted from the quantum dot sheet 16 may pass therethrough. For example, the second substrate 17 may be manufactured using a synthetic resin such as an acrylic resin, glass, or the like.

An example of the light transmitter 16a, the red light quantum dot unit 16b, and the green light quantum dot unit 16c disposed on the second substrate 17 will be described below.

The second polarizing filter 18 may be installed on one surface in the forward direction of the second substrate 17, and polarize the incident light. In an example, the second polarizing filter 18 may be a horizontal polarizing filter or a vertical polarizing filter.

The second polarizing filter 18 may be provided to have a polarizing axis different from that of the first polarizing filter 11. For example, the polarizing axis of the second polarizing filter 18 may be provided to cross the polarizing axis of the first polarizing filter 11 at a right angle. For example, when the first polarizing filter 11 is a vertical polarizing filter, the second polarizing filter 18 may be a horizontal polarizing filter. Thus, when a vibrating direction of the light passed through the first polarizing filter 11 is not changed, the light may not pass through the second polarizing filter 18, and thus, the light is not emitted to the outside of the display panel. In contrast, when the light passed through the first polarizing filter 11 passes through the liquid crystal layer 15, and the vibrating direction of the light is changed to be the same as the polarizing axis of the second polarizing filter 18, the light may pass through the second polarizing filter 18. In this case, the light may be emitted to the outside.

The second polarizing filter 18 may transmit or block the light passed through and emitted from the second substrate 17. Thus, at least one of the light mixture TL of the blue-based light and the green-based light emitted from the light transmitter 16a, red-based light RL emitted from the red light quantum dot unit 16b, and green-based light GL emitted from the green light quantum dot unit 16c may be emitted to the outside or blocked.

Figure 8A:
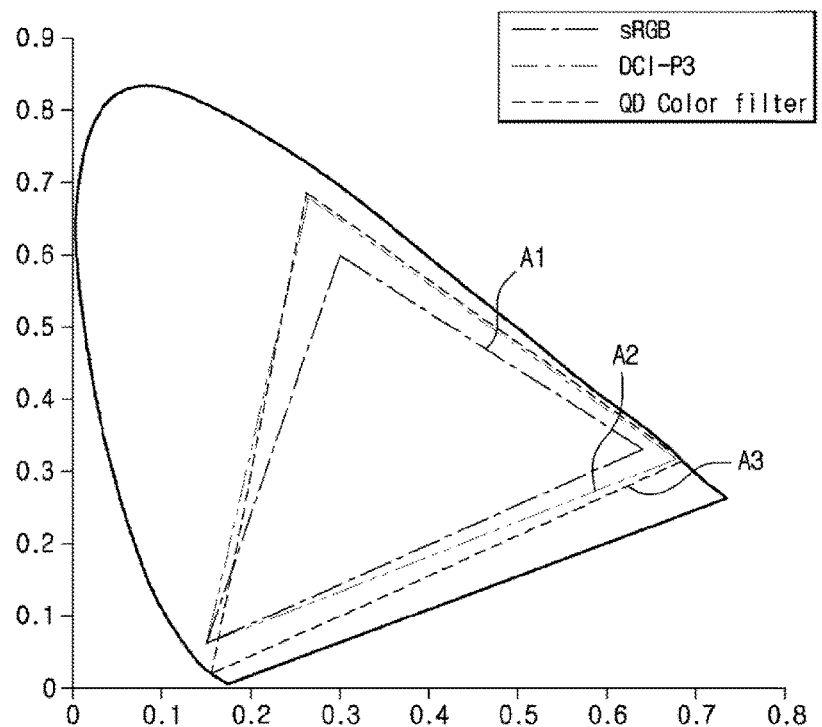
FIG. 8A is a view illustrating an example color gamut illustrating a color reproducing ratio by a conventional display panel.
Figure 8B:
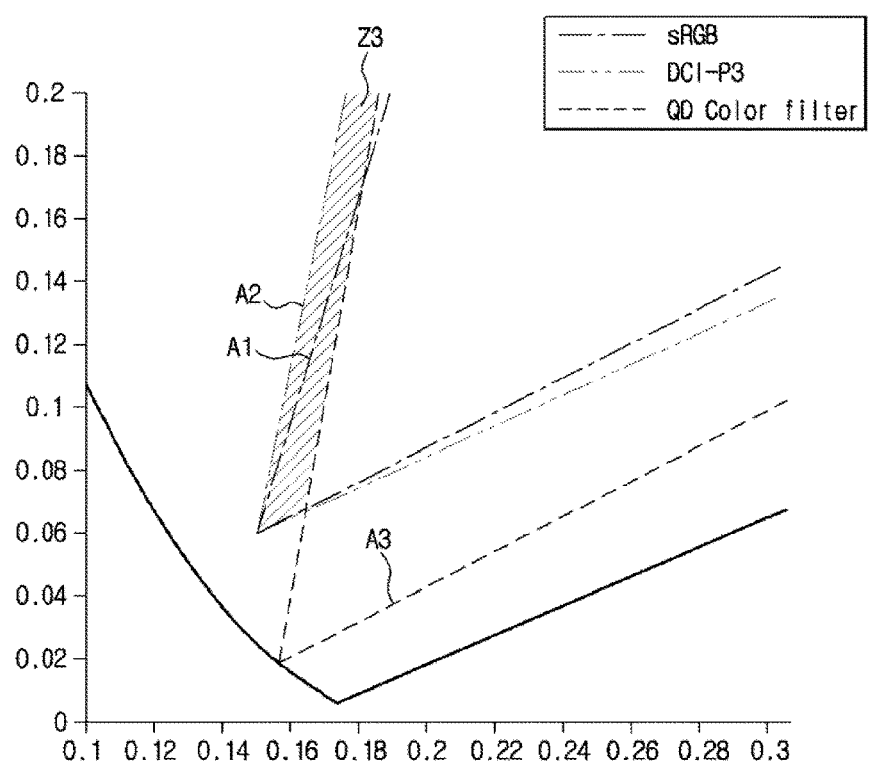
FIG. 8B is an enlarged view illustrating an area of a blue family in the color gamut of FIG. 8A.
Figure 9A:
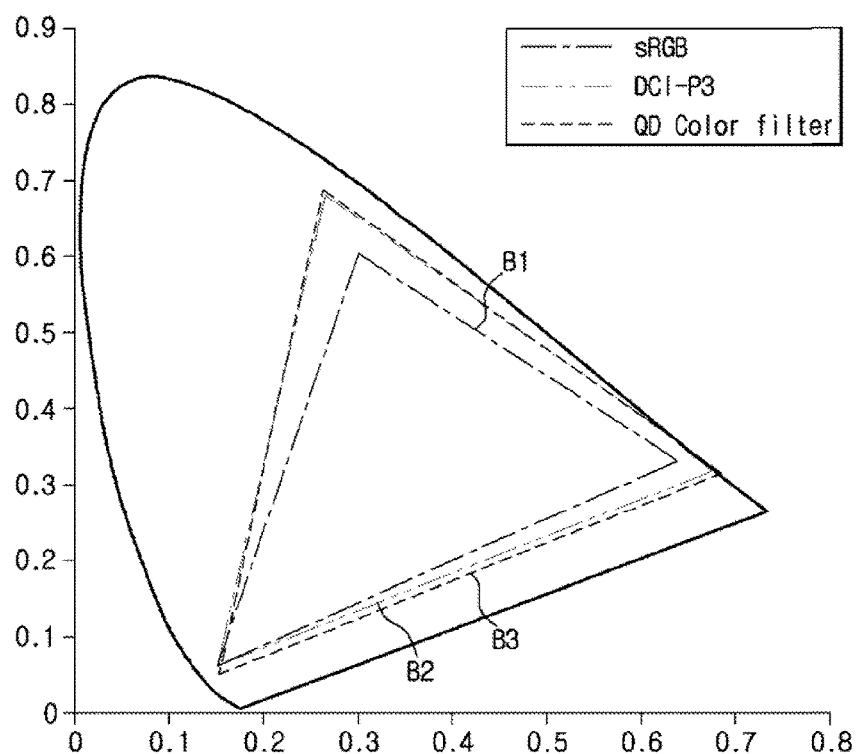
FIG. 9A is a view illustrating a color gamut illustrating an example color reproducing ratio by a display panel using a light converter included in a light converting unit or a light source.
Figure 9B:
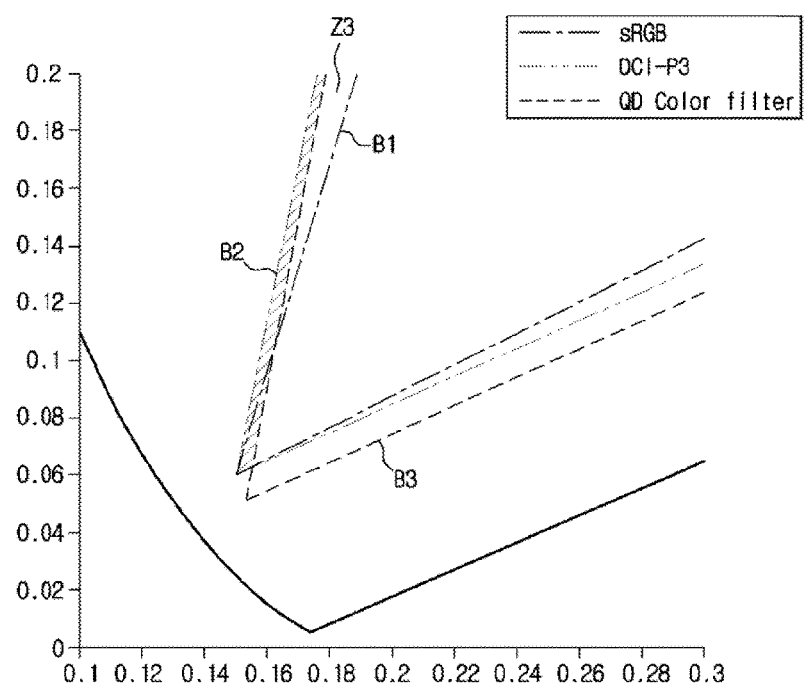
FIG. 9B is an enlarged view illustrating an area of a blue family in the color gamut of FIG. 9A.

FIG. 8A is a view illustrating an example color gamut for illustrating an example color reproducing ratio by a conventional display panel, and FIG. 8B is an enlarged view illustrating an area of the blue family in the color gamut of FIG. 8A. FIG. 8C is a table illustrating an example of locations of red, green, and blue in the color gamut of FIG. 8A. FIG. 9A is a view illustrating an example color gamut for illustrating an example color reproducing ratio by a display panel using a light converter in a light converting unit or a light source, and FIG. 9B is an enlarged view illustrating an area of the blue family in the color gamut of FIG. 9A. FIG. 10 is a table illustrating an example of locations of red, green, and blue in the color gamut of FIG. 9A.

Triangles of FIGS. 8A, 8B, 9A, and 9B represent color gamuts, and respectively represent color areas A1 and B1 (hereinafter, a first color area) by sRGB, color areas A2 and B2 (hereinafter, a second color area) by DCI-P3, a color area A3 (hereinafter, a third color area) which may be acquired using quantum dot sheets, and a color area B3 (hereinafter, a fourth color area) which may be acquired by including the green light converting unit in the light transmitter 16a of the quantum dot sheet 16 of the display panel 10 or providing the light converter 2d (shown in FIG. 3) in the light source. An inside of each of the triangles represents an area displayed by a color, and the outside of the triangles represent an area which is not displayable by a color.

Tables of FIGS. 8C and 10 represent color coordinates in color gamuts of red R, green G, and blue B in each color gamut.

As described above, when the green light converting unit is included in the light transmitter 16a of the quantum dot sheet 16 of the display panel 10, the color of the blue family may be more suitably displayed although a blue light emitting diode is used as a light source.

For example, when the green light converting unit is not included in the light transmitter 16a and a part of the light emitted from the blue light emitting diode is not converted by the light converter 2d (shown in FIG. 3), since the blue light emitted from the blue light emitting diode directly passes through the light transmitter 16a without an additional conversion process, the color is not easy to be displayed by sRGB color areas A1 and B1 or DCI-P3 color areas A2 and B2 which are generally used standard color coordinates.

For example, the third color area A3 which may be acquired using a display panel using a conventional quantum dot sheet may be different from the first color area A1 or the second color area A2 described in FIGS. 8A and 8B. In this case, some area Z3 of the first color area A1 or the second color area A2 may exist outside the third color area A3. Thus, some color which may be displayed by the sRGB color areas A1 and B1 or DCI-P3 color areas A2 and B2 may not be displayed by the display panel using the quantum dot sheet. For example, the above problem is significant in the blue color as described in FIGS. 8A to 8C. Referring to FIG. 8C, a y coordinate indicating the blue B of the display panel using the quantum dot sheet is 0.019, and may be greatly different from a y value 0.06 of sRGB corresponding thereto and a y value 0.06 of DCI-P3 corresponding thereto, and thus, the blue color of the display panel using the quantum dot sheet may be more turbid.

When the green light converting unit is included in the light transmitter 16a, as described in FIGS. 9A and 9B, the fourth color area B3 different from the third color area A3 which may be acquired using the display panel using the conventional quantum dot sheet may be acquired. For example, referring to FIG. 10, coordinates of the red R and the green G in the fourth color area B3 are respectively the same as those of the red R and green G in the third color area A3, but coordinates (0.153, 0.051) of the blue B in the fourth color area B3 are different from coordinates (0.157, 0.019) of the blue B in the third color area A3. In other words, the color area of the blue family is changed, and thus, color reproducibility of the blue family is also changed.

Referring to FIGS. 9A and 9B, some area Z3 existing outside the third color area A3 is disposed in the fourth color area B3. Thus, when the display panel 10 includes the green light converting unit in the light transmitter 16a, a color which is not displayable in the display panel using the conventional quantum dot sheet, for example, color corresponding to some area Z3 may be displayed, thereby improving color reproducibility.

Also, referring to FIGS. 9A and 9B, in the case of the display panel 10 including the green light converting unit in the light transmitter 16a, the fourth color area B3 covers almost all of the first color areas A1 and B1 by sRGB color areas A1 and B1, and is also equal to or similar to the second color area A2 and B2 by DCI-P3 color areas A2 and B2. Thus, the display panel 10 including the green light converting unit in the light transmitter 16a may display all or almost of the color area by sRGB color areas A1 and B1 and DCI-P3 color areas A2 and B2. Thus, almost all of the colors required for the display device including the display panel using the quantum dot sheet may be naturally displayed.

Various examples in which a red light quantum dot unit, a green light quantum dot unit, and a light transmitter are disposed on a substrate will be described.

Figure 11:
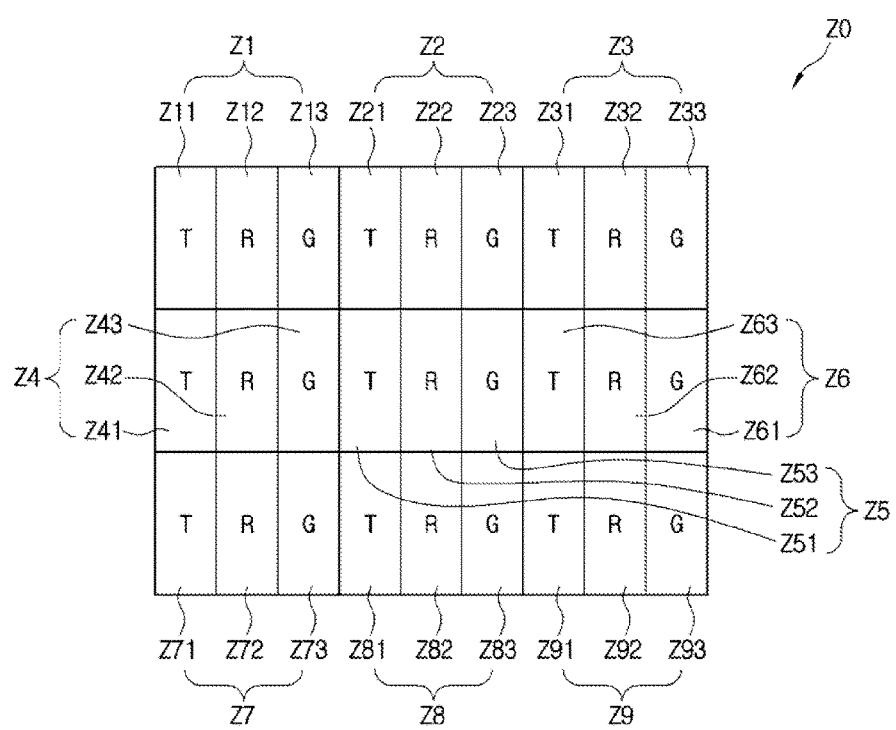
FIG. 11 is a view illustrating a first example of a structure in which a red light quantum dot unit, a green light quantum dot unit, and a light transmitter are disposed.

FIG. 11 is a view illustrating a first example of a structure in which a red light quantum dot unit, a green light quantum dot unit, and a light transmitter are disposed.

Referring to FIG. 11, the light transmitter 16a, the red light quantum dot unit 16b, and the green light quantum dot unit 16c may be disposed in one area Z0 of the second substrate 17 in a predetermined pattern. The one area Z0 refers, for example, to one polarizing plate formed by combining the light transmitter 16a, the red light quantum dot unit 16b, and the green light quantum dot unit 16c or a portion of a substrate on which the light transmitter 16a, the red light quantum dot unit 16b, and the green light quantum dot unit 16c are disposed.

The one area Z0 may be divided into a plurality of unit areas Z1 to Z9, and the light transmitter 16a, the red light quantum dot unit 16b, and the green light quantum dot unit 16c may be disposed in each of the unit areas Z1 to Z9.

Each of the unit areas Z1 to Z9 may form one pixel in an image. The pixel refers to a minimum unit forming the image, and the image may be formed by aggregating light output from the pixels. In the one pixel, light of different colors may be output, and light of various colors may be expressed in one pixel by combination of the light of different colors.

Patterns on which the light transmitter 16a, the red light quantum dot unit 16b, and the green light quantum dot unit 16c are disposed in each unit areas Z1 to Z9 may be substantially the same. For example, the arrangement type in which the light transmitter 16a, the red light quantum dot unit 16b, and the green light quantum dot unit 16c are disposed in any one of the unit areas Z1 to Z9 may be the same as the arrangement type in which the light transmitter 16a, the red light quantum dot unit 16b, and the green light quantum dot unit 16c are disposed in different unit areas Z1 to Z9.

The unit areas Z1 to Z9 may respectively include a plurality of sub areas Z11 to Z93, and the light transmitter 16a may be disposed in at least one sub area Z11, Z21, Z31, Z41, Z51, Z61, Z71, Z81, and Z91 among the plurality of sub areas Z11 to Z93, and at least one of the red light quantum dot unit 16b and the green light quantum dot u 16c may be disposed in different sub areas Z12, Z13, Z22, Z23, Z32, Z33, Z42, Z43, Z52, Z53, Z62, Z63, Z72, Z73, Z82, Z83, Z92, and Z93.

Each of the unit areas Z1 to Z9, as described in FIG. 11, may include three sub areas among the sub areas Z11 to Z93, and the light transmitter 16a, the red light quantum dot unit 16b, and the green light quantum dot unit 16c may be sequentially disposed in each of the sub areas Z11 to Z93 in a predetermined sequence. In this case, the sequence of arranging the light transmitter 16a, the red light quantum dot unit 16b, and the green light quantum dot unit 16c may be determined by arbitrary selection of the designer.

When the light transmitter 16a, the red light quantum dot unit 16b, and the green light quantum dot unit 16c are disposed in each of the unit areas Z1 to Z9 and the blue light is incident onto the light transmitter 16a, the red light quantum dot unit 16b, and the green light quantum dot unit 16c, the blue light, red light, and green light may be emitted in each of the unit areas Z1 to Z9. The emitted blue light, the red light, and the green light may solely form a color, or form a color by combining two or more kinds of colored light. Thus, each of the unit areas Z1 to Z9 may emit light of various colors.

Figure 12:
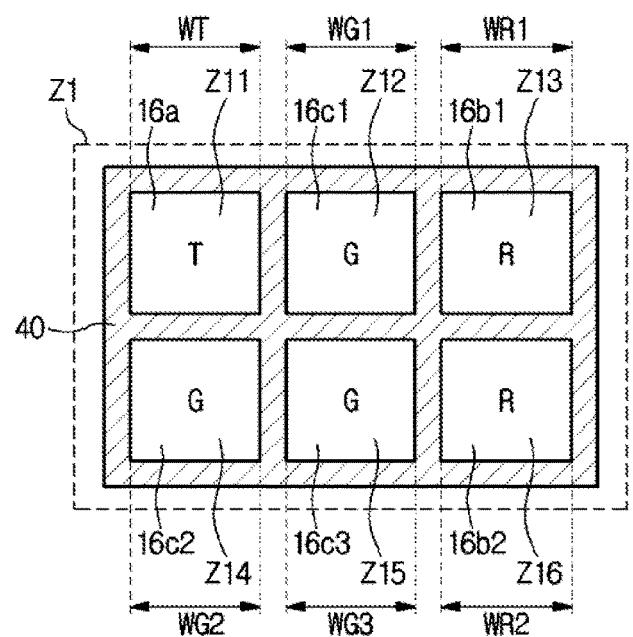
FIG. 12 is a view illustrating a second example of a structure in which a red light quantum dot unit, a green light quantum dot unit, and a light transmitter are disposed.

FIG. 12 is a view illustrating a second example of a structure in which a red light quantum dot unit, a green light quantum dot unit, and a light transmitter are disposed. In FIG. 12, only one unit area Z1 is described, but the red light quantum dot unit, the green light quantum dot unit, and the light transmitter may be disposed in different unit areas Z2 to Z9 as described in FIG. 12.

As described in FIG. 12, one unit area Z1 may include four or more sub areas Z11 to Z16. For example, the unit area Z1 may include six sub areas Z11 to Z16 separated from each other, and the six sub areas may be arranged in two rows of three sub areas.

At least one of the light transmitter 16a, red light quantum dot units 16b1 and 16b2, and green light quantum dot units 16c1, 16c2, and 16c3 may be disposed in the sub areas Z11 to Z16.

In an example, as described in FIG. 8, at least one of the red light quantum dot units 16b1 and 16b2, and the green light quantum dot units 16c1, 16c2, and 16c3 may be disposed in a greater number than the light transmitter 16a. For example, one light transmitter 16a may be disposed in one unit area Z1, and two red light quantum dot units 16b1 and 16b2 may be disposed in the unit area Z1, and three green light quantum dot units 16c1, 16c2, and 16c3 may be disposed in the unit area Z1.

The light transmitter 16a, the red light quantum dot units 16b1 and 16b2, and the green light quantum dot units 16c1, 16c2, and 16c3 installed in respective sub areas Z11 to Z16 may be provided to be in contact with each other, and may be provided to be separated from each other by a predetermined distance.

The light transmitter 16a, the red light quantum dot units 16b1 and 16b2, and the green light quantum dot units 16c1, 16c2, and 16c3 may be disposed in various arrangements based on selection of the designer. For example, as described in FIG. 12, the light transmitter 16a may be disposed in the first sub area Z11, and the green light quantum dot units 16c1, 16c2, and 16c3 may be disposed in the second sub area Z12, the fourth sub area Z14, and the fifth sub area Z15, and the red light quantum dot units 16b1 and 16b2 may be disposed in the third sub area Z13 and the sixth sub area Z16.

Areas of the first red light quantum dot unit 16b1, the second red light quantum dot unit 16b2, the first green light quantum dot unit 16c1, the second green light quantum dot unit 16c2, the third green light quantum dot unit 16c3, and the light transmitter 16a may be the same, or some of the areas may be different from each other, or all of the areas may be different from each other. The difference of sizes thereof may be determined according to a ratio of amounts of the emitted red light, the green light, and the blue light. For example, when an amount of the emitted green light may be smaller than amounts of the different red light and the blue light, the green light quantum dot units 16c1, 16c2, and 16c3 emitting the green light may be disposed in the unit area Z1 in a greater number than the red light quantum dot units 16b1 and 16b2 and the light transmitter 16a.

In another example, the number of the red light quantum dot units 16b1 and 16b2 and the green light quantum dot units 16c1, 16c2, and 16c3 disposed in the unit area Z1 may be equal to the number of the light transmitters 16a disposed in the unit area Z1.

As described above, various examples illustrating the light transmitter 16a, the red light quantum dot unit 16b, and the green light quantum dot unit 16c disposed on the second substrate 17 is described, but the arrangement of the light transmitter 16a, the red light quantum dot unit 16b, and the green light quantum dot unit 16c is not limited thereto. According to selection of the designer, the light transmitter 16a, the red light quantum dot unit 16b, and the green light quantum dot unit 16c may be disposed in the unit area Z1 to Z9 in various patterns compared with the above description.

Figure 13:
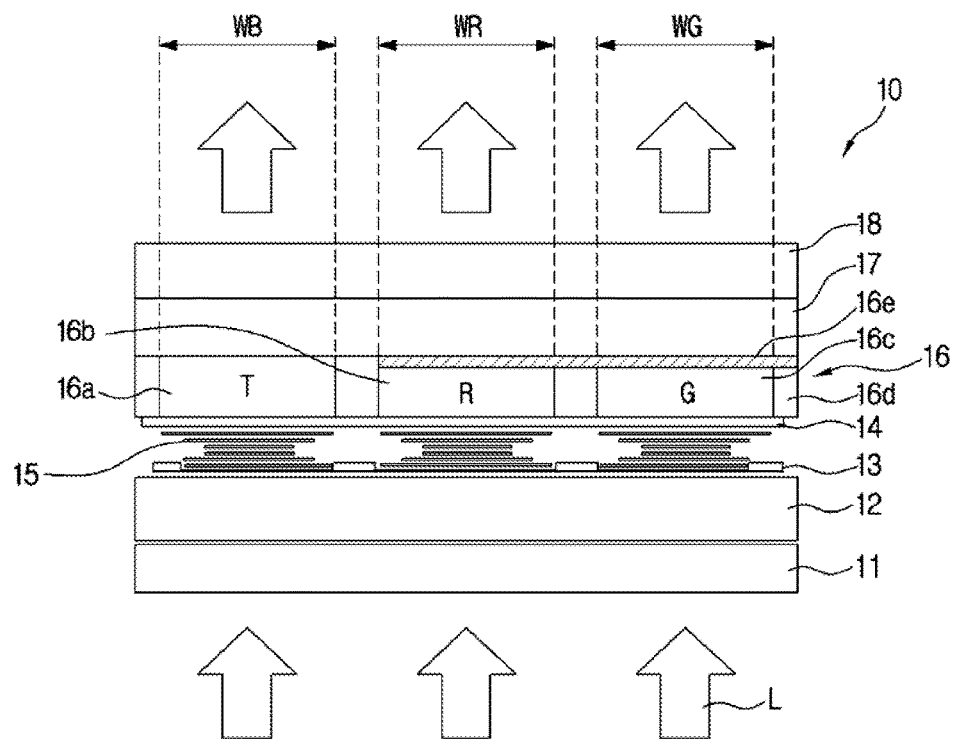
FIG. 13 is a side cross-sectional view illustrating another example of a display panel.

FIG. 13 is a side cross-sectional view illustrating another example of a display panel.

As described in FIG. 13, the display panel 10 may include a first polarizing filter 11, a first substrate 12, a first electrode 13, a second electrode 14, a liquid crystal layer 15, a quantum dot sheet 16, a filter 16e, a second substrate 17, and a second polarizing filter 18.

The first polarizing filter 11, the first substrate 12, the first electrode 13, the second electrode 14, the liquid crystal layer 15, the quantum dot sheet 16, the second substrate 17, and the second polarizing filter 18 are previously described, and thus, detailed description thereof will be omitted.

The filter 16e may filter a part of light emitted from the quantum dot sheet 16.

For example, the filter 16e may be installed to be in contact with at least one of the red light quantum dot unit 16b and the green light quantum dot unit 16c. In this case, the filter 16e may be installed on both of the red light quantum dot unit 16b and the green light quantum dot unit 16c, and when the filtering part 16e is installed on both of the red light quantum dot unit 16b and the green light quantum dot unit 16c, one filter 16e may be installed on both of the red light quantum dot unit 16b and the green light quantum dot unit 16c.

In an example, the filter 16e may include a blue light cut-off filter configured to filter the blue-based light. The cut-off filter may be a filter configured to filter light of a predetermined wavelength range and transmit remaining light except the predetermined wavelength range, and the blue light cut-off filter may be a filter configured to filter the blue-based light, and transmit the green-based light and the red-based light. The filter 16e may be formed in a film shape.

The red light quantum dot unit 16b and the green light quantum dot unit 16c may emit a part of blue-based light. For example, a part of the blue-based light incident onto the red light quantum dot unit 16b may not meet a red quantum dot particle but may pass through the red light quantum dot unit 16b and be emitted. In this case, the transmitted blue-based light may convert red-based light emitted from the red light quantum dot unit 16b into the blue-based light, thereby decreasing color reproducibility. Since the filter 16e is disposed on an emitting surface of the red light quantum dot unit 16b, the blue-based light emitted from the red light quantum dot unit 16b may be removed or reduced, and the red-based light may be emitted from the red light quantum dot unit 16b. In a similar manner, the filter 16e may remove or reduce the blue-based light emitted from the green light quantum dot unit 16c, and green-based light may be emitted from the green light quantum dot unit 16c.

Various examples of display devices used in display panels will be described with reference to FIGS. 14 to 22.

Figure 14:
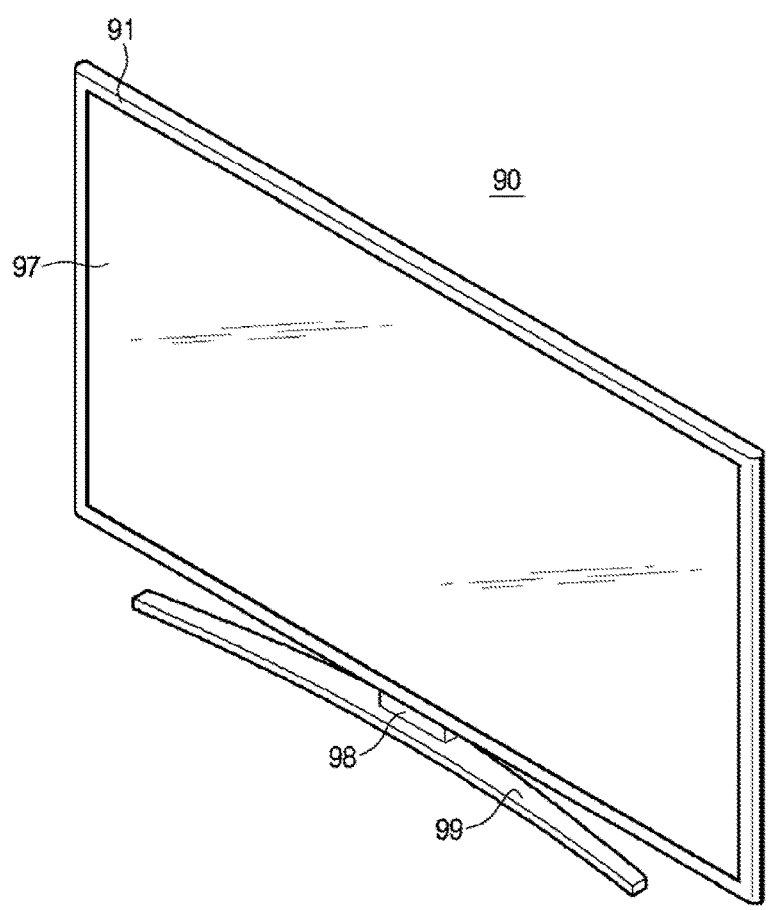
FIG. 14 is a perspective view illustrating an exterior of an example of a display device.

FIG. 14 is a perspective view illustrating an exterior of an example of a display device.

As described in FIG. 14, a display device 90, in an exterior, in the example of the disclosure, may include an external housing 91, an image display part 97, a support 98, and a leg 99.

The external housing 91 forms an exterior of the display device 90, and includes components configured to display various images by the display device 90 or perform various operations thereof. The external housing 91 may be integrally formed, and may be a combination of a plurality of housings, for example, a front housing 101 (shown in FIG. 16) and a rear housing 102 (shown in FIG. 16). A middle housing 103 (shown in FIG. 16) may be further provided in the external housing 91.

The image display part 97 may be installed on a front of the external housing 91 and display various images to the outside. For example, the image display part 97 may display at least one of a still image or moving image. The image display part 97 may be realized using a display panel 95, and may be realized using additional parts such as a touch panel, or the like, if necessary.

The support 98 supports the external housing 91 and serves to connect the external housing 91 to the leg 99. The support 98, according to selection of the designer, may have various shapes, or may be omitted, if unnecessary. The support 98, may be attached to or detached from the external housing 91.

The leg 99 is connected to the support 98 and the external housing 91 may be stably disposed on a floor. The leg 99 may be combined with or separated from the support 98. The leg 99 may be directly connected to the external housing 91. The leg 99 may be omitted in some embodiments.

Figure 15:
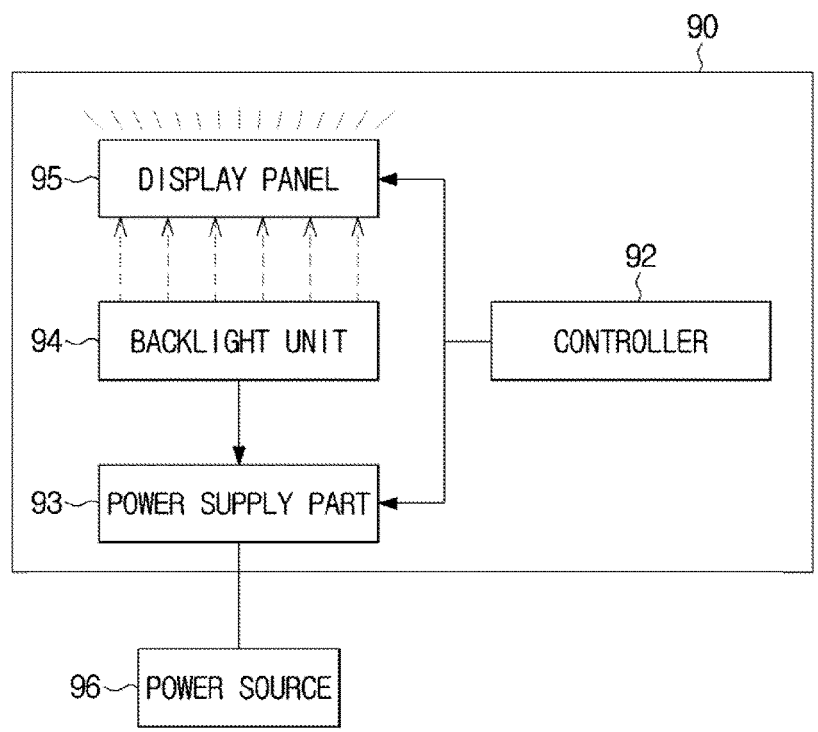
FIG. 15 is a structural view illustrating an example of a display device.

FIG. 15 is a structural view illustrating an embodiment of a display device.

As shown in FIG. 15, a display device 90, in an example, may include a controller 92, a power supply part 93, a backlight unit 94, and a display panel 95.

The controller 92 may be configured to control the power supply part 93, the display panel 95, or the like, and thus, the display panel 95 may display a predetermined still image or moving image. The controller 92 may be realized by a processor, and the processor may be realized using one or more semiconductor chip and various components configured to operate the semiconductor chip. Meanwhile, the display device 90 may further include a storage device (not shown) configured to store various types of data in order to support the operation of the processor, and the storage media may be realized using semiconductor storage devices such as a RAM or ROM, magnetic disk storage devices such as a hard disk, or the like.

The power supply part 93 may supply electric power required to output a predetermined image to the backlight unit 94, the display panel 95, or the like. The power supply part 93 may be electrically connected to an external commercial power source 96. The power supply part 93 may rectify an alternating current (AC) power source from the commercial power source 96 into a direct current (DC) power source required to operate the display device 90, or change a voltage to a required level, or perform an operation of removing noise from the DC power source. In some embodiments, the power supply part 93 may include a battery capable of storing electric power.

The backlight unit 94 generates light based on input electric power, and radiates the light in a direction toward the display panel 95. The backlight unit 94 may be realized using a light emitting unit such as a light emitting diode configured to emit light based on applied power, and may further include a diffusion sheet, a light guide plate, or the like, and thus, the emitted light is sufficiently incident onto all of a surface of the display panel 95. When the display panel 95 is a self emissive type such as an organic light emitting diode (OLED) display panel, the backlight unit 94 may be omitted. A more detailed description of the backlight unit 94 will be provided below.

The display panel 95 may generate an image using the incident light. In some examples, the display panel 95 may control emitting light using liquid crystals, and also, the display panel 95 may further use a quantum dot sheet 118 (shown in FIG. 18) and emit light of a particular color. Also, the display panel 95 may generate and emit light by itself, and, in this case, the backlight unit 94 may be omitted. When the display panel 95 is a self emissive type, the display panel 95 may use an OLED or an active matrix OLED and generate light in the self emissive type. A more detailed description of the display panel 95 will be provided below.

Figure 16:
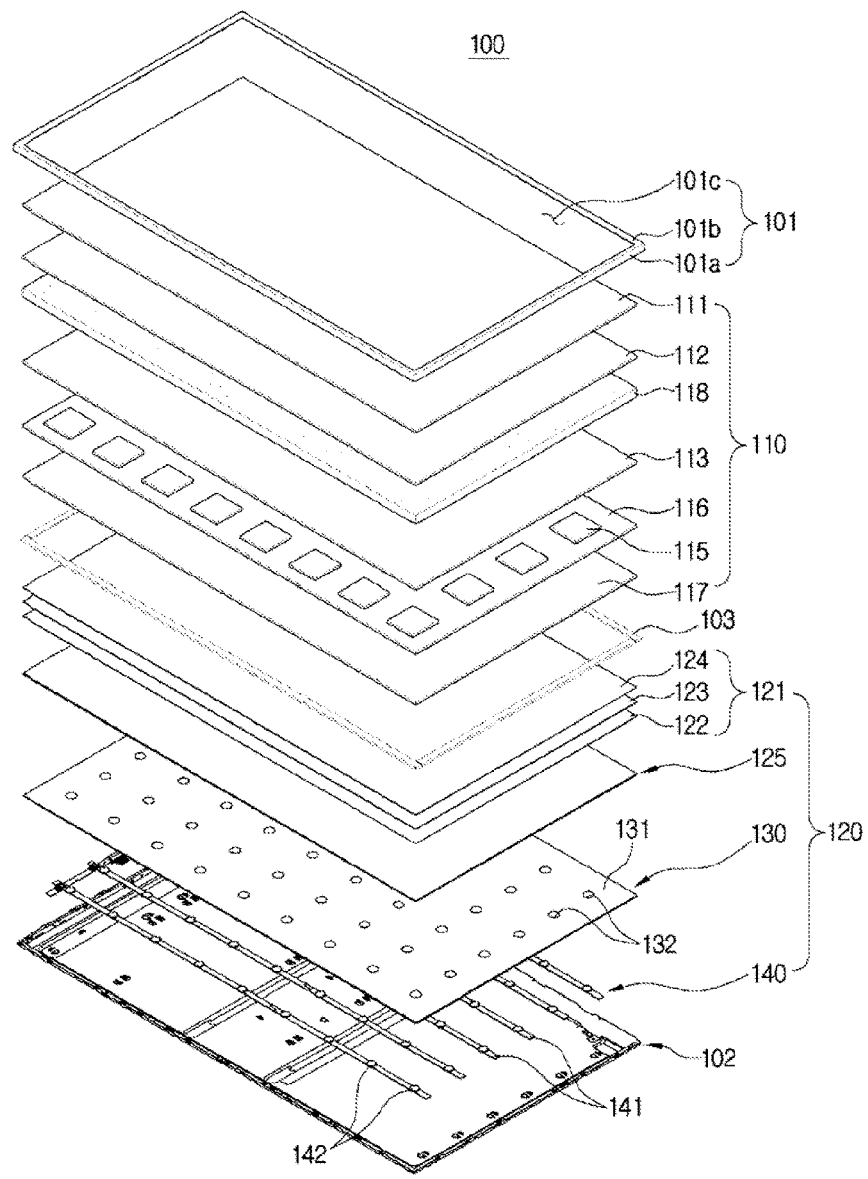
FIG. 16 is an exploded perspective view illustrating a first example of a display device.
Figure 17:
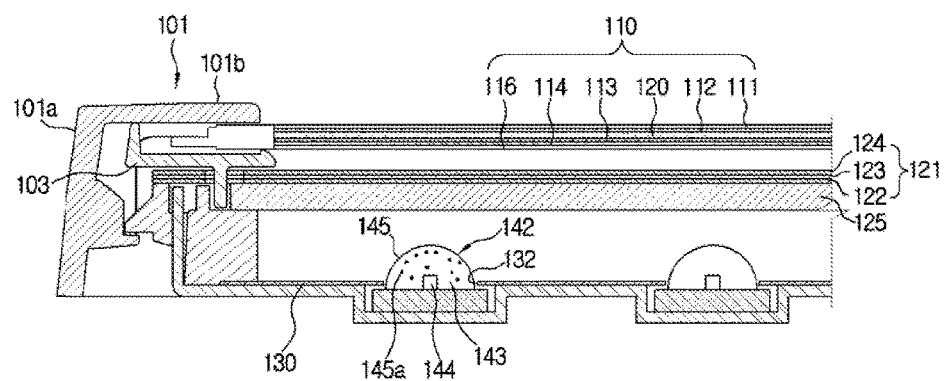
FIG. 17 is a side cross-sectional view illustrating the first example of the display device.
Figure 18:
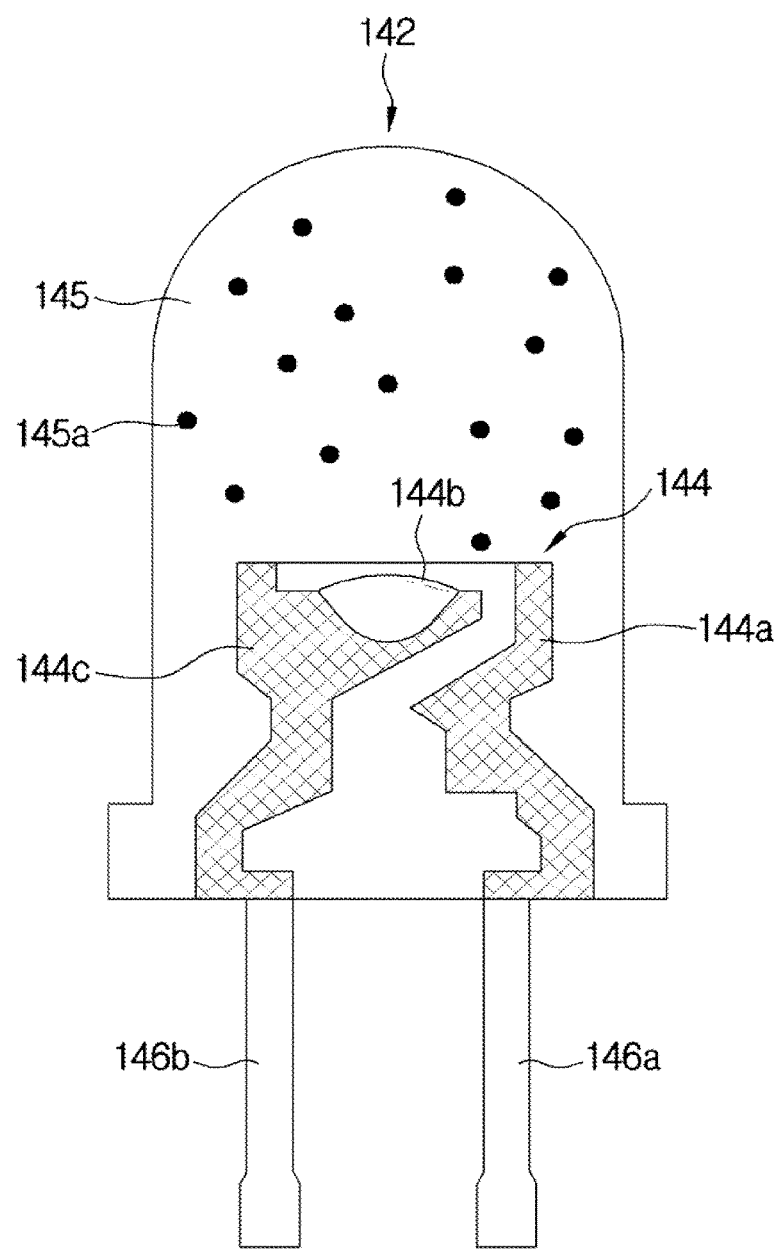
Figure 19:
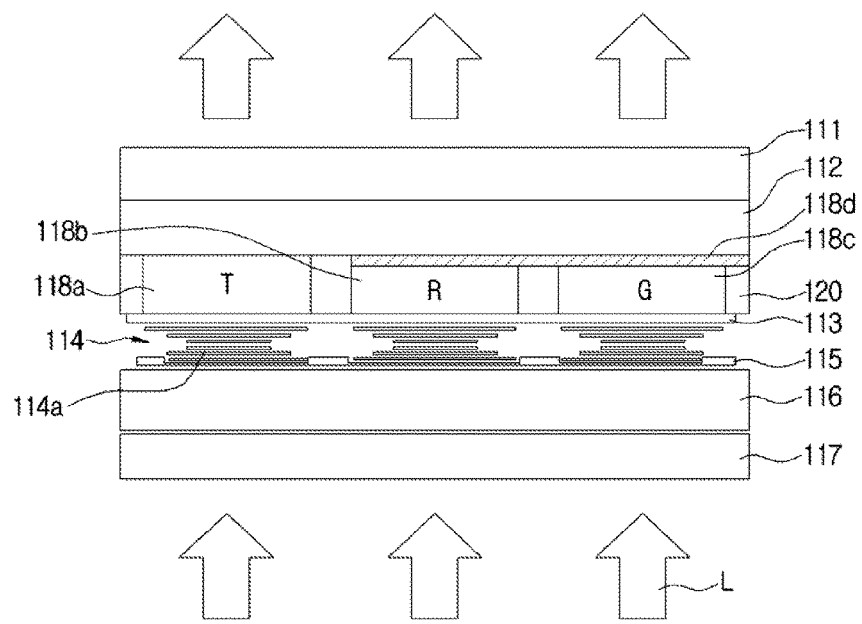
FIG. 19 is a side cross-sectional view illustrating an example display panel of a first example of the display device.

FIG. 16 is an exploded perspective view illustrating a first example of a display device, and FIG. 17 is a side cross-sectional view illustrating the first example of the display device. FIG. 18 is a view illustrating a blue light emitting diode illumination lamp as an example of a light source of the display device, and FIG. 19 is a side cross-sectional view illustrating a display panel according to a first example of the display device. For convenience of description, upward directions of FIGS. 16 and 17 are referred to as forward directions, and downward directions of FIGS. 16 and 17 are referred to as rearward directions.

In the first example, the display device 100, as described in FIGS. 16 and 17, may include housings 101 and 102 configured to form an exterior, a display panel 110 configured to generate an image, and a backlight unit (BLU) 120 configured to supply light to the display panel 110.

In an example, the housings 101 and 102 may include a front housing 101 installed in the forward direction, a rear housing 102 installed in the rearward direction, and the display panel 110 may include a second polarizing filter 111, a second substrate 112, a quantum dot sheet 118, a second electrode 113, a first electrode 115, a first substrate 116, and a first polarizing filter 117, and the BLU 120 may include an optical plate 121, a diffusion plate 125, a reflecting plate 130, and a light emitter 140. According to selection of the designer, some of the above may be omitted, and also additional components, for example, a touch screen panel, or the like may be added.

The front housing 101 may be disposed in the most forward direction of the display device 100, and form an exterior of a front surface and a side surface of the display device 100. The front housing 101 may be combined with the rear housing 102 to include and fix various types of components of the display device 100 in the display device 100. The front housing 101 may stably fix the various types of components included in the display device 100, and simultaneously protect the components from a direct impact of the outside.

The front housing may include a fixing part 101b forming a bezel and a side part 101a extending from an end portion of the fixing part 101b in a direction toward the rear housing 102. An opening 101c is formed in the front of the front housing 101.

The side part 101a may be combined with the rear housing 102, and the front housing 101 may be combined with the rear housing 102. The side part 101a may fix various types of components in the display device 100, and protect the various types of components included in the display device 100 from an impact transmitted in a sideward direction.

The fixing part 101b may be protruded in a direction toward the opening 101c, and fix various types of components such as the second polarizing filter 111, the second substrate 112, and the quantum dot sheet 118, and prevent the dislocation of the various types of components to the outside or partial exposure thereof.

The image formed by the light passed through the second polarizing filter 111 is displayed through the opening 101c, and thus, a user may view the image.

The rear housing 102 may be disposed in the rearmost direction of the display device 100, and may form an exterior of the rear surface and the side surface of the display device 100. The rear housing 102 may be combined with the front housing 101, and the various types of components of the display device 100 are included in the display device 100. In some examples, the front housing 101 and the rear housing 102 may be integrally formed.

The light emitter 140 and the reflecting plate 130 may be fixedly installed on an inside surface of the rear housing 102.

The light emitter 140 may include a light source 142 for emitting light and a third substrate 141 on which the light source 142 is mounted.

A plurality of the light sources 142 may be installed on the third substrate 141 in a predetermined pattern. For example, the plurality of light sources 142 may be installed on the third substrate 141 in a straight line form or various forms. Also, only one light source 142 may be installed on the third substrate 141. A driving power line configured to supply a driving power to the light source 142, or the like may be formed on the third substrate 141, and the light source 142 may be connected to a signal cable (not shown) and a backlight driving circuit (not shown) through the driving power line. The third substrate 141 may be manufactured using various materials such as a synthetic resin, or the like, and in some examples, may include a transparent material such as a poly methylmethacrylate resin, a glass plate, or the like.

The light sources 142 may be arranged and installed on the third substrate 141 in a predetermined pattern, and at least one thereof may be provided. In this case, the predetermined pattern in which the light sources 142 are disposed may correspond to the arrangement pattern of quantum dot units in the quantum dot sheet 118. However, the arrangement pattern of the light source 142 is not limited thereto, and the light sources 142 may be disposed on the third substrate 141 in various patterns which may be considered by the designer.

The light source 142 may radiate light of a predetermined color in various directions. The light of the predetermined color may include blue-based light. The blue-based light may, for example, have a wavelength in a range of 400 nm to 500 nm, and refers to light optically viewed as a blue color. In order to emit the blue-based light, the light source 142 may be realized using a blue light emitting diode.

The light source 142, for example, may include a light bulb, a halogen lamp, a fluorescent lamp, a sodium lamp, a mercury lamp, a fluorescent mercury lamp, a xenon lamp, an arc illumination lamp, a neon tube lamp, an EL lamp, an LED lamp, or the like, and additionally, various illumination devices which may be considered by the designer may be included in the light source 142.

An example of the light source 142 will be described in more detail below.

In an example, as illustrated in FIG. 18, the light source 142 may include a light emitting unit 144 and a transparent body 145.

The light emitting unit 144 may include a positive electrode frame 144a, an LED reflecting plate 144b, a negative electrode frame 144c, and a light emitting chip (not shown).

The positive electrode frame 144a and the negative electrode frame 144c are electrically connected to external electric power through portions 146a and 146b exposed to the outside, respectively. When the external electric power is applied, a current flows from the positive electrode frame 144a to the negative electrode frame 144c, and the current flows through the light emitting chip installed on the negative electrode frame 144c with the LED reflecting plate 144b.

The light emitting chip may, for example, be realized using a PN junction diode. The light emitting chip may be electrically connected to the positive electrode frame 144a and the negative electrode frame 144c through a plurality of electrodes, and generate and emit light based on the current applied to the positive electrode frame 144a and the negative electrode frame 144c. In this case, the emitted light may be the blue-based light. In an example, the light emitting chip may be realized using gallium nitride (GaN), aluminum gallium nitride (AlGaN), indium gallium nitride (InGaN), or the like. The light emitting chip may be installed on an inner surface of the LED reflecting plate 144b.

The LED reflecting plate 144b may reflect light emitted from the light emitting chip, and the emitted light may proceed in a predetermined direction. For example, the LED reflecting plate 144b may move the light in a direction toward the transparent body 145. The LED reflecting plate 144b may be formed of a material capable of easily reflecting the light emitted from the light emitting chip.

The transparent body 145 may, for example, comprise a material capable of transmitting light such as a synthetic resin, acrylic resin, etc., glass, or the like, and may be manufactured in various shapes. For example, as illustrated in FIG. 18, the transparent body 145 may have a shape of a semi-sphere formed on a cylinder. A lens may be provided on one end of the transparent body 145, and the lens may have the hemispherical shape.

The positive electrode frame 144a, the LED reflecting plate 144b, the negative electrode frame 144c, the light emitting chip, or the like may be fixedly installed in an inner space 143 of the transparent body 145.

In an example, a light converter 145a configured to convert a color of the emitted light into a different color may be provided in the transparent body 145.

As described above, the light converter 145a may include a green light converting unit, and the green light converting unit, for example, may include a green quantum dot particle or a green fluorescent particle. The green quantum dot particle or the green fluorescent particle may float in the inner space 143 of the transparent body 145 in the form of a droplet.

The green quantum dot particle, as described above, refers to a semiconductor crystal having a size of about 2 nm to 3 nm, and the green fluorescent particle changes a wavelength of the incident light to convert light of a predetermined color into green-based light. In an example, the green fluorescent particle may include a green fluorescent body having a wavelength having a peak of 540 nm or less.

In an example, both the green quantum dot particles and the green fluorescent particles may be used as the green light converting unit, and in this case, the green quantum dot particles and the green fluorescent particles may exist in the transparent body 145 at a predetermined ratio. The predetermined ratio may be changed by arbitrary selection of the designer.

When the blue-based light is emitted from the light emitting chip, the light converter 145a may convert a part of blue-based light into the green-based light, and thus, as described in FIG. 4, the light source 142 may emit a mixture of the blue-based light and the green-based light. Thus, the light L emitted from the light source 142 by the light converter 145a may be more close to a green color than the blue-based light emitted from a conventional blue light emitting diode. Thus, as described above, color reproducibility generated by the color of the light emitted from the blue light emitting diode may be improved.

In some examples, the light converter 145a may be omitted. In this case, the above light converting unit may be provided in the light transmitter 118a (shown in FIG. 19).

The light radiated from the light source 142 may be directly radiated in the forward direction which is a direction toward the diffusion plate 125, or reflected by the reflecting plate 130 and then radiated in the forward direction.

The reflecting plate 130 may be installed on the rear housing 102, and reflect the light, which is emitted from the light source 142 and proceeds in the rearward direction or the sideward direction, in the forward direction or a similar direction thereto.

In an example, at least one through-hole 132 into which the light source 142 is inserted and installed may be provided through the reflecting plate 130, and in this case, the light source 142 may be installed by being inserted into the through-hole 132 in the rearward direction of the reflecting plate 130 and is exposed in a direction toward a reflecting surface 131. Also, in some examples, the through-hole 132 may not be installed through the reflecting plate 130, and in this case, the light source 142 may be installed on the reflecting surface 131 of the reflecting plate 130, and may be installed on an additional substrate including a transparent material which transmits light.

The reflecting plate 130 may, for example, be manufactured using a synthetic resin such as polycarbonate (PC), polyethylene terephthalate (PET), or the like, and also, may be manufactured with various metals. Additionally, the reflecting plate 130 may be manufactured with various materials which may be considered by the designer.

At least one optical plate 121 and at least one diffusion plate 125 may be provided in the forward direction of the reflecting plate 130. The light emitted from the light source 142 or the light reflected from the reflecting plate 130 may be incident onto at least one diffusion plate 125.

The diffusion plate 125 may serve to diffuse incident light. The diffusion plate 125 may diffuse the incident light and disperse the light radiated from the light source 142 in various directions. The light radiated from the light source 142 may pass through the diffusion plate 125 and be incident onto the optical plate 121.

The optical plate 121, for example, may include at least one diffusion sheet 122, at least one prism sheet 123, and at least one protection sheet 124. The diffusion sheet 122, the prism sheet 123, and the protection sheet 124 may be formed in a film shape.

The diffusion sheet 122 may serve to offset a pattern of the diffusion plate 125. Since the light dispersed by the diffusion plate 125 is directly incident onto the eyes, the pattern of the diffusion plate 125 is viewed by the eyes, and thus, the diffusion sheet 122 may offset or minimize the pattern of the diffusion plate 125.

The prism sheet 123 may refract the light diffused by the diffusion sheet 122 and the light is incident onto the first substrate 116 in the vertical direction. Prisms may be arranged on one surface of the prism sheet 123 in a predetermined pattern. In an example, a plurality of the prism sheets 123 may be provided.

The protection sheet 124 may be disposed adjacent to the first polarizing filter 117, and protect the diffusion sheet 122, the prism sheet 123, or the like from an external impact or contaminants.

The optical plate 121, as described above, may be formed to include the diffusion sheet 122, the prism sheet 123, and the protection sheet 124, or may be formed by omitting one or more of them, or may be formed to include more sheets additionally. Also, the optical plate 121 may be formed using a complex sheet in which functions of the above sheets are included.

The light passed through the optical plate 121 may be incident onto the first polarizing filter 117.

The middle housing 103 may be provided between the optical plate 121 and the first polarizing filter 117. The middle housing 103 may fix the back light unit (BLU) 120, or partition the display panel 110 from the BLU 120. The middle housing 103 may include a protrusion protruding in a direction toward the display panel 110 and the BLU 120, and the BLU 120 may be fixed by the protrusion. The middle housing 103 may be integrally formed with the front housing 101 or the rear housing 102. The middle housing 103 may be omitted in some examples.

The first polarizing filter 117 may polarize light incident onto the first substrate 116 from the light source 142, and the light vibrating in the same direction as a predetermined polarizing axis may be incident onto the first substrate 116. One surface of the first polarizing filter 117, as described in FIGS. 16 and 17, may be in contact with or adjacent to a rear surface of the first substrate 116. The first polarizing filter 117 may be formed in a film shape. In an example, the first polarizing filter 117 may include a vertical polarizing filter or a horizontal polarizing filter. The vertical direction refers to a direction parallel with a line segment vertically passing through an upper interface and a lower interface of the display device, and the horizontal direction refers to a direction parallel with the upper interface and the lower interface.

The first electrode 115 may be installed on one surface of the first substrate 116 in the forward direction, and the first polarizing filter 117 may be installed on one surface in the rearward direction. The first substrate 116 may be formed of a transparent material through which the light passed through the first polarizing filter 117 in the rearward direction is transmitted. For example, the first substrate 116 may be realized using a synthetic resin such as an acrylic resin, or the like, or glass or the like. The first substrate 116, in some examples, may include a FPCB.

The first electrode 115 may apply a current to a liquid crystal layer 114 along with the second electrode 113, and adjust an arrangement of the liquid crystal molecules 114a in the liquid crystal layer 114. According to the arrangement of the liquid crystal molecules 114a, the display panel 110 may display various images.

In an example, the first electrode 115 may be realized using a TFT. The first electrode 115 may be connected to external electric power, and receive electric power. A plurality of the first electrodes 115 may be installed on the first substrate 116, and the first electrodes 115 may be installed on the first substrate 116 in a predetermined pattern. The pattern of the first electrodes 115 may be determined based on selection of the designer.

The second electrode 113 may be provided to correspond to the first electrode 115 with respect to the liquid crystal layer 114, and may serve to apply a current to the liquid crystal layer 114 along with the first electrode 115. One surface of the second electrode 113 in the forward direction may be provided to be in contact with the quantum dot sheet 118, and one surface in the rearward direction may be provided to be in contact with or adjacent to the liquid crystal layer 114. The second electrode 113 may be a common electrode.

The liquid crystal layer 114 may be provided between the second electrode 113 and the first electrode 115, and the liquid crystal layer 114 may include a plurality of liquid crystal molecules 114a.

The liquid crystal molecules 114a, as described above, may be arranged in a plurality of columns in the liquid crystal layer 114, and may be aligned in a predetermined direction or twisted in a spiral shape based on an electrical field.

When the liquid crystal molecules 114a are aligned in a straight line, a vibration direction of the light polarized by the first polarizing filter 117 is not changed and the light passes through the liquid crystal layer 114, and when the liquid crystal molecules 114a are twisted and arranged in the spiral shape, the vibration direction of the polarized light is converted in a direction perpendicular into an original vibration direction and the light passes through the liquid crystal layer 114. When a polarizing axis of the second polarizing filter 111 is different from that of the first polarizing filter 117, the light passed through the liquid crystal layer 114 without the change of the vibration direction may not pass through the second polarizing filter 111, and the light passed through the liquid crystal layer 114 and polarized in the horizontal direction may pass through the second polarizing filter 111. A part of the light passed through the liquid crystal layer 114 may pass through the second polarizing filter 111 and be emitted to the outside, but the remaining light may be blocked by the second polarizing filter 111 and may not be emitted to the outside.

The quantum dot sheet 118 may convert the incident light of a predetermined color into a different color, or may output without converting into the different color. When blue-based light is incident, the quantum dot sheet 118 may directly transmit and emit the blue-based light, or may convert into red-based light or green-based light and emit. By the quantum dot sheet 118, the display panel 110 may emit light of various colors to the outside, and thus, the display device 100 may display various colors on a screen.

One surface of the quantum dot sheet 118 in the rearward direction, in an embodiment, may be provided to contact the second electrode 113, and one surface in the forward direction may be provided to be in contact with the second substrate 112.

The quantum dot sheet 118 may include a light transmitter 118a configured to transmit the blue-based light, at least one red light quantum dot unit 118b configured to convert the incident blue-based light into red light, and at least one green light quantum dot unit 118c configured to convert the incident blue-based light into green light.

The light transmitter 118a, the red light quantum dot unit 118b, and the green light quantum dot unit 118c, as described in FIG. 19, may be provided to correspond to one group of liquid crystal molecules of the liquid crystal layer 114. For example, one group of liquid crystal molecules 114a may be provided to correspond to one light transmitter 118a, and another group of liquid crystal molecules 114a may be provided to correspond to one red light quantum dot unit 118b, and still another group of liquid crystal molecules 114a may be provided to correspond to one green light quantum dot unit 118c.

The light transmitter 118a may not change a part of the incident blue-based light, and directly emit the light to the outside, and another part may be converted into the green-based light and emitted. For example, the light transmitter 118a may include a main body and light converting units disposed in the main body, and in an embodiment, may further include dispersion particles disposed in the main body.

The light converting unit may change the color of the light incident onto the main body and emit in a direction toward the second substrate 112. For example, when the incident light is the blue-based light, the light converting unit may convert the blue-based light into the green-based light or the red-based light and emit. In an example, the light converting unit may include the green light converting unit configured to convert the blue-based light into the green-based light, and here, the green light converting unit may include at least one of the above green quantum dot particle and the green fluorescent particle. The light converting unit may be omitted when the light converter 145a is provided in the light source 142.

The dispersion particle may disperse the incident blue-based light and emit in a direction toward the second substrate 112. Thus, the blue light transmitted and emitted from the second polarizing filter 111 and the second substrate 112 may be the same as the above red-based light and the green-based light, or may be viewed in a viewing angle similar thereto. The dispersion particle may use zinc oxide, titanium oxide, silicon oxide, or the like.

Since the converting unit and the dispersion particle are described with reference to FIGS. 1 and 2, the detailed description thereof will be omitted.

The red light quantum dot unit 118b and the green light quantum dot unit 118c may convert the blue-based light radiated from the light source 142 using a quantum dot into the red-based light or green-based light, and emit in a direction toward the second substrate 112. The quantum dot of the red light quantum dot unit 118b may be provided to be relatively larger than the quantum dot of the green light quantum dot unit 118c. The light emitted from the red light quantum dot unit 118b and the green light quantum dot unit 118c may be dispersed and emitted.

The light transmitter 118a may be provided to be relatively smaller than at least one of the red light quantum dot unit 118b and the green light quantum dot unit 118c, and for example, the light transmitter 118a may be provided to have a width smaller than at least one of the red light quantum dot unit 118b and the green light quantum dot unit 118c.

The light transmitter 118a, the red light quantum dot unit 118b, and the green light quantum dot unit 118c may be in contact with each other, or may be spaced apart from each other by a predetermined distance. When the light transmitter 118a, the red light quantum dot unit 118b, and the green light quantum dot unit 118c are spaced apart from each other, a partition wall may be provided therebetween.

The red light quantum dot unit 118b and the green light quantum dot unit 118c may be provided in a larger number in the quantum dot sheet 118 than in the light transmitter 118a. For example, as described above, the red light quantum dot unit 118b and the green light quantum dot unit 118c may be disposed in a larger number than in the light transmitter 118a in at least one unit area in the quantum dot sheet 118.

The red light quantum dot unit 118b, the green light quantum dot unit 118c, and the light transmitter 118a are already described above, and thus, the detailed description thereof will be omitted.

In an example, a filter 118d configured to filter a part of the emitted light may be provided on one surface of the red light quantum dot unit 118b and the green light quantum dot unit 118c in the forward direction. The filter 118d may be formed in a film shape. In an example, the filter 118d may filter the blue-based light which is not changed yet by the red light quantum dot unit 118b and the green light quantum dot unit 118c. When the filter 118d filters the blue-based light, the filter 118d may be realized using a blue light cut-off filter. One surface of the filter 118d in the rearward direction may be in contact with or adjacent to at least one of the red light quantum dot unit 118b and the green light quantum dot unit 118c, and one surface in the forward direction may be installed to be in contact with or adjacent to the second substrate 112.

The quantum dot sheet 118 may be installed on one surface of the second substrate 112 in the rearward direction, and the second polarizing filter 111 may be installed on one surface in the forward direction. In an example, a filter 118d may be installed on the one surface in the rearward direction of the second substrate 112.

For example, red light quantum dot units, green light quantum dot units, and light transmitters may be installed on the second substrate 112 in predetermined patterns, respectively. In this case, the second substrate 112 may be provided to be divided into a plurality of unit areas, and in each unit area, the red light quantum dot units, the green light quantum dot units, and the light transmitters may be provided to be installed in the same pattern. Each of the unit areas may include a plurality of sub areas. The red light quantum dot unit, the green light quantum dot unit, and the light transmitter may be installed in each sub area.

The second substrate 112 may be formed of a transparent material to transmit red light, green light, and blue light emitted from the quantum dot sheet 118, and for example, may be manufactured using a synthetic resin such as an acrylic resin, or the like or glass or the like.

The second polarizing filter 111 may be installed on one surface of the second substrate 112 in the forward direction, and may polarize incident light. The light passed through and emitted from the second substrate 112, for example, red-based light, green-based light, and blue-based light, may be incident onto the second polarizing filter 111, and may be transmitted by the second polarizing filter 111 or be blocked by the second polarizing filter based on a vibration direction.

A polarizing axis of the second polarizing filter 111 may be provided to be perpendicular to a polarizing axis of the first polarizing filter 117, and thus, when the first polarizing filter 117 is a vertical polarizing filter, the second polarizing filter 111 may be a horizontal polarizing filter.

When the polarizing axis of the second polarizing filter 111 is perpendicular to the polarizing axis of the first polarizing filter 117, and the liquid crystal molecules 114a of the liquid crystal layer 114 are aligned in a straight line to transmit the light passed through the first polarizing filter 117, the vibration direction of the light passed through the first polarizing filter 117 is not changed, and may not pass through the second polarizing filter 111, and thus, the light passed through the second substrate 112 may not be emitted to the outside. In contrast, when the liquid crystal molecules 114a of the liquid crystal layer 114 are aligned in a spiral shape and transmits the light passed through the first polarizing filter 117, the vibration direction of the light passed through the first polarizing filter 117 may be changed and may pass through the second polarizing filter 111, and thus, the light passed through the second substrate 112, for example, at least one of the red-based light, the green-based light, and the blue-based light may be emitted to the outside.

Since, while at least one of the red-based light, the green-based light, and the blue-based light is emitted to the outside, at least one is combined or not combined, a predetermined color is formed, and the display device 100 may display a predetermined image using at least one of the above red-based light, the green-based light, and the blue-based light.

The display device 100 according to an example of the disclosure is described, but various components may be added to the above described components. For example, a fourth substrate on which various components configured to control various operations of the display device 100 may be further provided. Here, the various components, for example, may include a processor or a storage device realized by one or two or more semiconductor chips, various circuits, or various components configured to support the operation of the processor. The fourth substrate may be installed on various positions, for example, may be fixedly installed inside the rear housing 102. Additionally, various components which may be considered by a designer may be provided on the display device 100.

Figure 20:
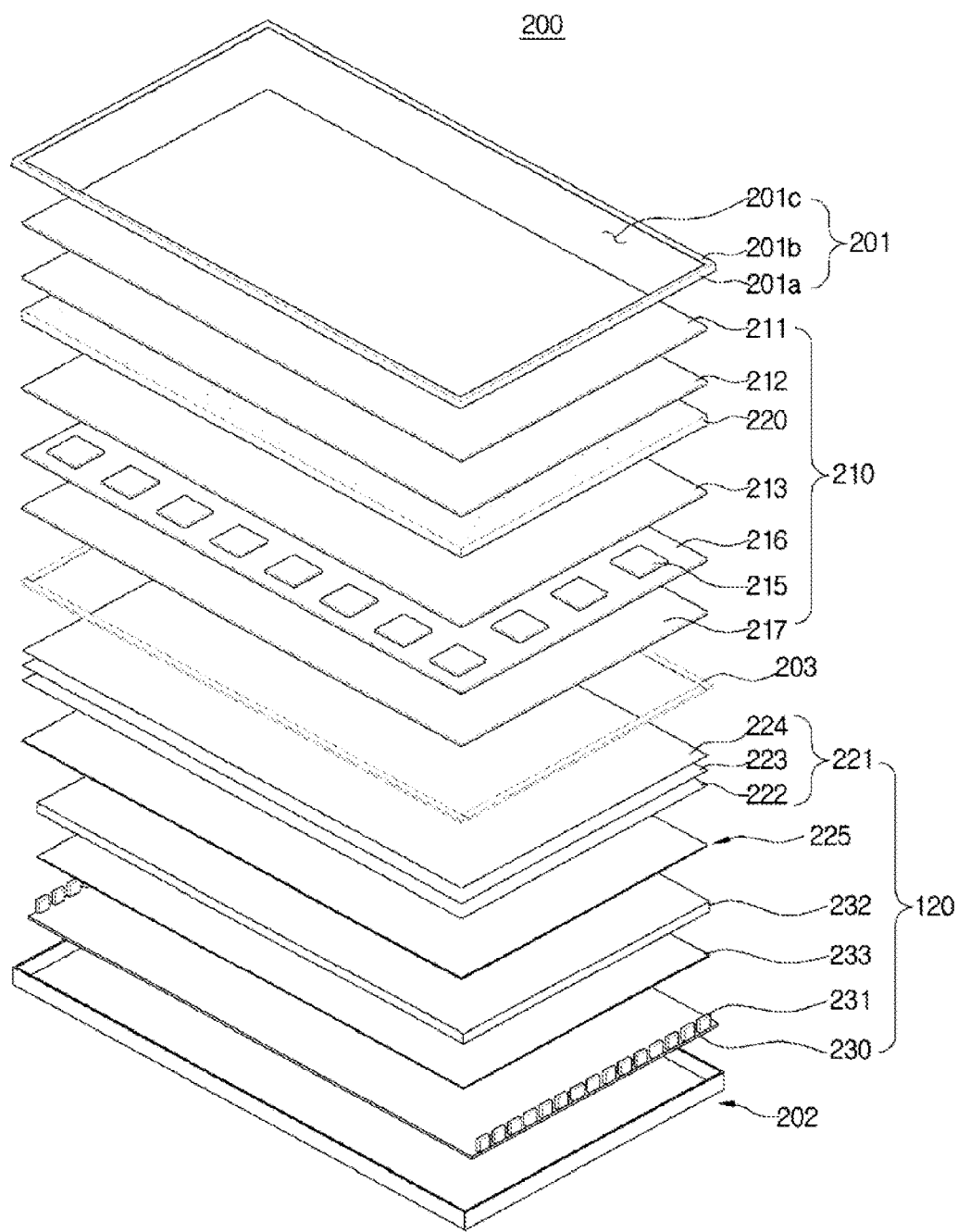
FIG. 20 is an exploded perspective view illustrating a second example of a display device.
Figure 21:
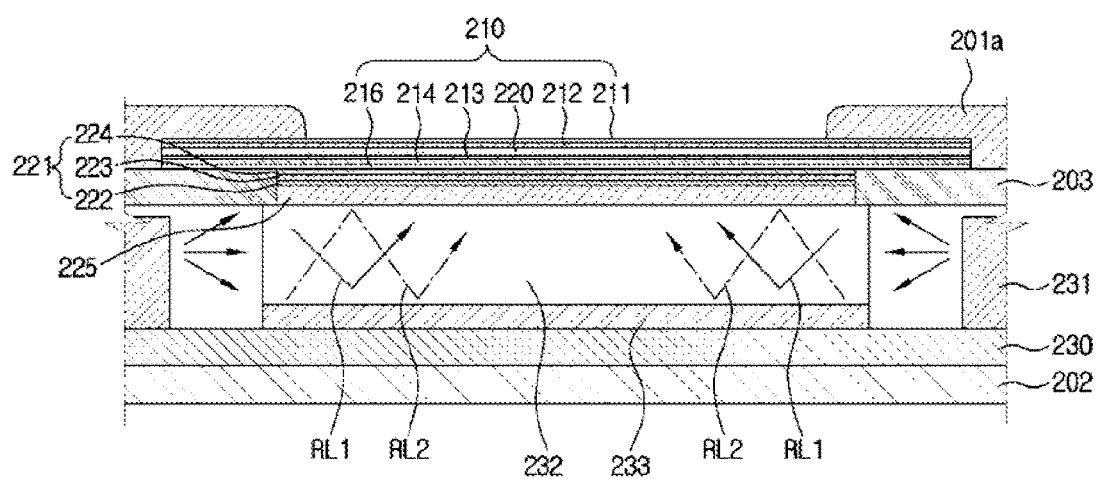
FIG. 21 is a side cross-sectional view illustrating the second example of the display device.

FIG. 20 is an exploded perspective view illustrating a second example of a display device, and FIG. 21 is a side cross-sectional view illustrating the second example of the display device.

According to the second example of the display device 200 as illustrated in FIGS. 20 and 21, the display device 200 may include housings 201 and 202 configured to form an exterior, a display panel 210 configured to generate an image, and a BLU 120 configured to supply light to the display panel 210.

Specifically, the housings 201 and 202 may include a front housing 201 installed in the forward direction, a rear housing 202 installed in the rearward direction, and the display panel 210 may include a second polarizing filter 211, a second substrate 212, a quantum dot sheet 220, a second electrode 213, a first electrode 215, a first substrate 216, and a first polarizing filter 217, and the BLU 120 may include an optical plate 221, a diffusion plate 225, a fourth substrate 230, a light source 231, a light guide plate 232, and a reflecting plate 233. According to selection of the designer, some of them may be omitted.

The front housing 201 may be disposed in the most forward direction of the display device 200, and the rear housing 202 may be disposed in the most rearward direction of the display device 200, and both of them are combined to form an exterior of the display device 200. The front housing 201 may include a fixing part 201b for forming a bezel and a side part 201a extended from an end portion of the fixing part 201b in a direction toward the rear housing 202. An opening 201c may be formed on a front of the front housing 201.

The fourth substrate 230 may be installed inside the rear housing 202. The fourth substrate 230 applies an electric signal to the light source 231, and the light source 231 may radiate light of a predetermined wavelength. Various components configured to control the light source 231 may be provided on the fourth substrate 230. Also, a processor or the like configured to various operations of the display device in addition to the light source may be installed on the fourth substrate 230. The processor may be realized by one or two or more semiconductor chips and related components.

A spacer (not shown) configured to protect one surface of the fourth substrate 230 may be provided on the fourth substrate 230. The reflecting plate 233 and the light guide plate 232 may be sequentially installed in a forward direction of the spacer.

The light source 231 may be installed on the fourth substrate 230, and emit light of a predetermined color in a sideward direction of the light guide plate 232. The light of a predetermined color may include blue-based light. The light source 231 may be installed on the side surface of the light guide plate 232 to be separated from the light guide plate 232. The light source 231 may be installed along the side surface of the light guide plate 232 on at least one end of the fourth substrate 230 in a straight line, or may be installed in two columns along both side surfaces of the light guide plate 232.

In some examples, the light source 231 may be directly installed on the fourth substrate 230, or installed on a holder additionally provided on the fourth substrate 230.

The light RL1 and RL2 radiated from the light sources 231 may be incident onto the light guide plate 232 through the side surfaces of the light guide plate 232, respectively. The light incident onto the light guide plate 232 may be totally or substantially reflected and transmitted in the light guide plate 232, and thus, the light may be uniformly incident onto one surface of the display panel 210.

The light source 231 may include a light bulb, a halogen lamp, a fluorescent lamp, a sodium lamp, a mercury lamp, a fluorescent mercury lamp, a xenon lamp, an arc illumination lamp, a neon tube lamp, an EL lamp, an LED lamp, or the like, and additionally, various illumination devices which may be considered by a designer may be included in the light source 231.

As described in FIG. 18, the light source 231 may include the light converter 145*a*, and when the light source 231 uses a blue light emitting diode, the light converter 145*a* may include a green light converting unit. The green light converting unit, for example, may include a green quantum dot particle, or a green fluorescent particle. In this case, the blue-based light may be mixed with the green-based light in the light source 231 and emitted, and thus, color reproducibility generated by the color of the light emitted from the blue light emitting diode may be improved. In some embodiments, the light source 231 may not include the light converter 145*a*. The light source 231 is described in detail with reference to FIG. 18, and thus, the detailed description thereof will be omitted.

The spacer may be installed on one surface of the fourth substrate 230 and protrude in the forward direction, and may prevent various components such as a semiconductor chip installed on the fourth substrate 230 from directly contacting the reflecting plate 233. Thus, damage of the components installed on the fourth substrate 230, the reflecting plate 170, or the like may be prevented.

The reflecting plate 233 may be installed on one surface of the spacer in a forward direction, and reflect a part RL1 and RL2 of the light proceeding in the light guide plate 232 in the rearward direction toward the forward direction or a direction similar thereto, and thus, the light radiated from the light source 231 may proceed in a direction toward the display panel 210. The reflecting plate 233, as described above, may be manufactured using a synthetic resin such as PET, PC, or the like. Additionally, the reflecting plate 233 may be manufactured using various materials which may be considered by a designer.

The light guide plate 232 may reflect the light RL1 and RL2 internally emitted from the light source 231 one time or more, and the light emitted from the light source 231 may be uniformly supplied to the display panel 210. The light radiated from the light source 231 is incident onto the side surface of the light guide plate 232. The display panel 210, the diffusion plate 225, or the optical plate 221 may be disposed to be in contact with the one surface of the light guide plate 232 in the forward direction, and the reflecting plate 233 may be disposed to be attached to one surface in the rearward direction. The light guide plate 232 may be manufactured using a material having high light transmission, and for example, may be manufactured using PMMA, or the like.

At least one of the diffusion plate 225 and the optical plate 221 may be disposed between the display panel 210 and the light guide plate 232.

The diffusion plate 225 may serve to diffuse incident light. The diffusion plate 225 may diffuse the incident light and may serve to substantially uniformly disperse the light radiated from the light source 231 in various directions.

The optical plate 221, for example, may include at least one diffusion sheet 222, at least one prism sheet 223, and at least one protection sheet 224. The diffusion sheet 122, the prism sheet 123, and the protection sheet 124 are as described above, and thus, the detailed description thereof will be omitted.

The diffusion plate 225 and the optical plate 221 may be omitted according to an embodiment, and may be substituted by a film or a substrate of a different type.

The light passed through the diffusion plate 225 and the optical plate 221 may be incident onto the rear surface of the display panel 210.

A middle housing 203 configured to fix the display panel 210 or the BLU 120 or separate the display panel 210 and the BLU 120 may be further provided between the display panel 210 and the BLU 120. The middle housing 203 may be omitted in some examples.

The display panel 210 may convert the incident light of a predetermined color into light of a different color or emit without conversion into the different color, and the display panel 210, as described in FIGS. 20 and 21, may include the first polarizing filter 217, the first substrate 216, the first electrode 215, the second electrode 213, a liquid crystal layer 214, the quantum dot sheet 220, the second substrate 212, and the second polarizing filter 211.

The first polarizing filter 217 polarizes the light incident from the light source 231 on the first substrate 216, and only a part of light vibrating in a direction the same as a predetermined polarizing axis may be incident onto the first substrate 216.

The first electrode 215 may be installed on the first substrate 216. The first substrate 216 may transmit the light passed through the first polarizing filter 217 to the liquid crystal layer 214.

The liquid crystal layer 214 may transmit the light passed through the first polarizing filter 217 in a direction toward the quantum dot sheet 220 based on the arrangement of the liquid crystal molecules.

The first electrode 215 and the second electrode 213 may generate an electrical field in the liquid crystal layer 214, and the liquid crystal molecules in the liquid crystal layer 214 may be arranged in a straight line or a spiral shape based on the generated electrical field.

The quantum dot sheet 220 may be provided to convert the incident light of a predetermined color, for example, blue-based light, into light of a different color, or may be provided to output the light without conversion to the different color. The quantum dot sheet 220 may include a light transmitter configured to transmit the blue-based light, at least one red light quantum dot unit configured to convert the incident blue-based light and emit red-based light, and at least one green light quantum dot unit configured to convert the incident blue-based light and emit green-based light.

The light transmitter may emit a part of the incident light in a direction toward the second substrate 212 without a change of color, and then emit another part in a direction toward the second substrate 212 after conversion of the color. In particular, the light transmitter 118a may include a main body including light transmitting material and a light converting unit disposed in the main body, and in an embodiment, the light transmitter 118a may further include dispersion particles disposed in the main body.

The light converting unit may change a color of the light incident onto the main body and emit in a direction toward the second substrate 212. For example, when the incident light is blue-based light, the light converting unit may convert the blue-based light into green-based light or red-based light and emit. In an example, the light converting unit may include a green light converting unit configured to convert the blue-based light into the green-based light, and here, the green light converting unit may be realized using at least one of the green quantum dot particle and the green fluorescent particle. The light converting unit may be omitted when the light converter is provided in the light source 231.

Since the light transmitter may emit the blue-based light mixed with a part of green-based light based on the light converting unit, the display device 200 may have increased expression related to the blue color, and thus, color reproducibility of the display device 200 may be improved.

The dispersion particle may disperse the incident blue-based light, and emit in a direction toward the second substrate 212. The dispersion particle may include zinc oxide, titanium oxide, silicon oxide, or the like.

The red light quantum dot unit and the green light quantum dot unit may convert the color of the blue-based light, which is emitted in a direction toward the display panel 210 through the light guide plate 232 using the quantum dot, into red-based light or green-based light, and emit in the direction toward the second substrate 212.

A filter such as a blue light cut-off filter may be installed on the red light quantum dot unit and the green light quantum dot unit. The filter may be installed on one surface of the red light quantum dot unit and the green light quantum dot unit in the forward direction, and may filter the blue-based light of the light emitted from the red light quantum dot unit and the green light quantum unit.

The second substrate 212 may transmit the light emitted from the quantum dot sheet 220. The quantum dot sheet 220 may be installed on the second substrate 212, and a filter may be further installed.

The second polarizing filter 211 may block or transmit a part of the red-based light, the green-based light, and the blue-based light emitted from the display panel 210. A polarizing axis of the second polarizing filter 211 may be different from a polarizing axis of the first polarizing filter 217 provided between the light guide plate 232 and the display panel 210, and in particular, both polarizing axes 240 and 269 may be perpendicular to each other.

A second example of the display device 200 is described, but various components may be further added based on selection of the designer. For example, a touch screen panel may be added to perform a touch operation related to the display device 200, or an additional film may be installed and attached to the display panel 210.

Figure 22:
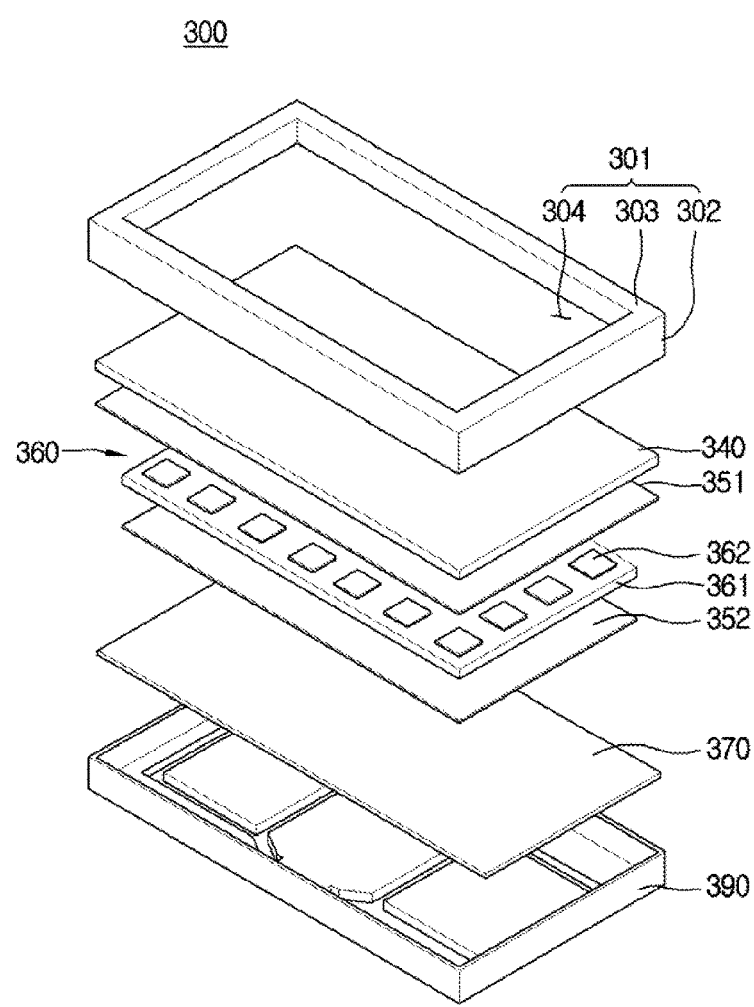
FIG. 22 is an exploded perspective view illustrating a third example of the display device.
Figure 23:
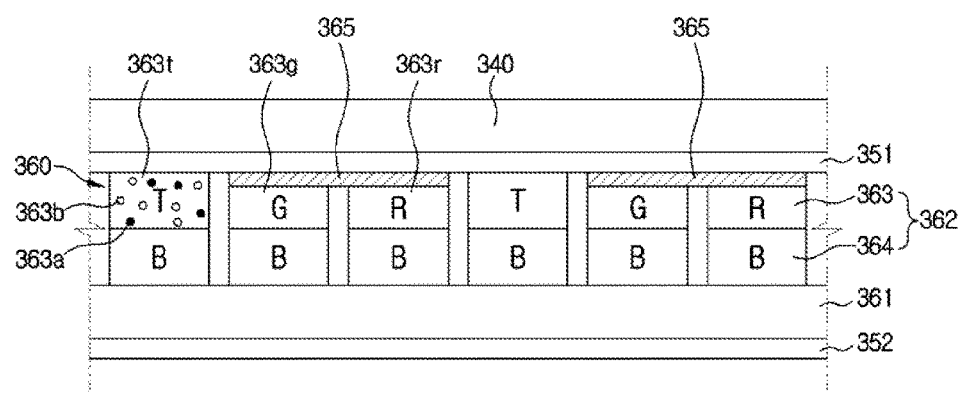
FIG. 23 is a side cross-sectional view illustrating the third example of the display device.

FIG. 22 is an exploded perspective view illustrating a third example of a display device, and FIG. 23 is a side cross-sectional view illustrating the third example of the display device.

As described in FIGS. 22 and 23, the display device 300 emits light using an OLED, and thus, the image may be displayed on the screen. For example, in the third example, the display device 300 includes, the front housing 301, the first substrate 340, electrodes 351 and 352, an OLED assembly 360, the second substrate 370, and the rear housing 390. Some of them may be omitted by selection of the designer.

The front housing 301 is disposed in the most forward direction of the display device 100, and the rear housing 390 is disposed in the most rearward direction of the display device 100, and both of them are combined and form the exterior of the display device 100.

The front housing 301 and the rear housing 390 include various components of the display device 300 in the display device 300, and may stably fix various components in the display device 100 and protect them from an external impact.

The front housing 301 may include a fixing part 303 forming a bezel, and the side part 302 formed to extend in a direction of the rear housing 390 from an end of the fixing parts 303. The side part 302 may be combined with the rear housing 390. An opening 304 may be formed on a front surface of the front housing 301.

The first substrate 340 is provided to be exposed to the outside in the forward direction, and an electrode 350 and the OLED assembly 360 are installed in the rearward direction thereof. Various optical sheets such as a protection film, a polarizing film, or the like may be installed on one surface of the first substrate 340 in the forward direction.

The first substrate 340 may be formed of a transparent material so that red-based light, green-based light, and blue-based light emitted from the OLED assembly 360 may pass therethrough, and for example, the first substrate 340 may be manufactured using a synthetic resin such as a polymethyl methacrylate resin, glass or the like.

The electrode 350 includes a first electrode 351 and a second electrode 352, and the OLED assembly 360 is provided between the first electrode 351 and the second electrode 352. The first electrode 351 and the second electrode 352 are electrically connected to an external electric power source, and have a negative polarity or a positive polarity based on the external electric power. When the first electrode 351 and the second electrode 352 have the negative polarity or the positive polarity, a current flows through a light emitter 364 including a fluorescent organic compound of the OLED assembly 360, and electrons are combined with holes in the light emitter 364, and thus, light is emitted.

The first electrode 351 may include a common electrode. The second electrode 352 may be provided to correspond to each light emitter 364. Thus, a plurality of second electrodes 352 may be provided based on the number of the light emitters 364.

At least one of the first electrode 351 and the second electrode 352 may be formed with a metal thin film formed in aluminum, silver, magnesium, calcium, a combination thereof, or the like, and in addition to the above, may be formed of indium tin oxide (ITO).

The OLED assembly 360 may include a light output part 362 configured to output light of a predetermined color and a substrate 361 on which the light output part 362 is installed, and the light output part 362 may include a color determination part 363 and a light emitter 364.

The light emitter 364 may receive electrons and holes based on the voltage applied to the first electrode 351 and the second electrode 352, and may emit light based on the recombination of the received electrons and holes. In an example, the light emitter 364 may include a blue phosphorescent unit configured to generate blue-based light.

Each of the light emitters 364, as described in FIG. 23, may be installed to correspond to a red light quantum dot unit 363r, a green light quantum dot unit 363g, and a light transmitter 363t of the color determination part 363. In other words, light generated from each of the light emitters 364 may be incident onto the red light quantum dot unit 363r, the green light quantum dot unit 363g, and the light transmitter 363t.

The color determination part 363 may convert the light of the predetermined color emitted from the light emitter 364 into light of a different color or output without conversion into the light of different color. The color determination part 363 may be provided to convert the blue-based light into red-based light or green-based light, or to emit a part of blue-based light without conversion.

For example, the color determination part 363 may include at least one red light quantum dot unit 363r configured to change the blue-based light and emit the red-based light, at least one green light quantum dot unit 363g configured to change the blue-based light and emit the green-based light, and a light transmitter 363t configured to transmit the blue-based light.

The light transmitter 363t may emit a part of blue-based light to the outside without conversion, and change the remaining blue-based light and emit. Also, the light transmitter 363t may disperse all or a part of the blue-based light and emit.

The light transmitter 363t may include a main body including a light transmitting material and at least one light converting unit 363a dispersed in the main body to convert the light of a predetermined color into light of a different color. In an example, the light transmitter 363t may further include dispersion particles 363b dispersed in the main body.

The light converting unit 363a may change a color of the light incident onto the main body and emit in a direction toward the second substrate 370. For example, when the light emitted from the light emitter 364 is blue-based light, the light converting unit 363a may convert the blue-based light into green-based light or red-based light and emit. In an example, the light converting unit 363a may include a green light converting unit configured to convert the blue-based light into the green-based light, and the green light converting unit may include at least one of the green quantum dot particle and the green fluorescent particle. Since a part of green-based light is mixed with the blue-based light emitted from the light transmitter 363t by the light converting unit 363a, the display device 300 may display the blue portion more precisely, and thus, color reproducibility of the display device 300 may be improved.

The dispersion particle 363b may disperse incident light and emit in the direction toward the second substrate 370. For example, when the light emitted from the light emitter 364 is blue-based light, the dispersion particle 363b may disperse the blue-based light and emit in the direction toward the second substrate 370. The dispersion particle may include zinc oxide, titanium oxide, silicon oxide, or the like.

The red light quantum dot unit 363r, the green light quantum dot unit 363g, and the light transmitter 363t are already described above, and thus, the detailed description thereof will be omitted.

In an example, an emitting surface through which the red-based light or the green-based light of at least one of the red light quantum dot unit 363r and the green light quantum dot unit 363g is emitted may be designed to be wider than an emitting surface through which the blue-based light of the light transmitter 363t is emitted. In an example, the OLED assembly 360 may include at least one of the red light quantum dot units 363r and the green light quantum dot units 363g in a relatively greater number than the light transmitters 363t.

The second electrode 352 may be installed on the second substrate 370, and various components configured to control various operations of the display device 100 may also be installed thereon. The various components installed on the second substrate 370 may include a processor or the like, and the processor may be realized by one or two or more semiconductor chips and related components. The processor provided on the second substrate 370 adjusts the application of electric power to the first electrode 351 and the second electrode 352, and the light output part 362 may emit the light.

The third example of the display device 300 including the OLED is described, but additional various components may be added based on selection of the designer. For example, a touch screen panel, a protection film, a reflecting plate, a polarizing plate, or the like may be further added in the display device 300.

As is apparent from the above description, in the display panel and the display device, color reproducibility of output screen is improved, and the display device can display an image having more suitable color.

According to the display panel and the display device, since a color of the bright blue family may be relatively displayed with the same or similar to a desired color, a display accuracy of a blue color on an output screen can be improved.

Although various examples of the disclosure have been illustrated and described, it would be appreciated by those skilled in the art that changes may be made in these examples without departing from the principles and spirit of the disclosure, the scope of which is defined in the claims and their equivalents.

What is claimed is:

1. A display device comprising:
   at least one light source; and
   a quantum dot sheet including:
      a quantum dot converter configured to convert a blue-based light emitted from the light source into at least one of a red-based light and/or a green-based light using at least one quantum dot element and to emit the at least one of the red-based light and/or a green-based light; and
      a light transmitter configured to transmit a part of the blue-based light emitted from the light source,
   wherein the at least one light source comprises:
      a light emitter main body;

a light emitter embedded in the light emitter main body and configured to emit the blue-based light; and at least one light converter particle configured to absorb a part of blue-based light emitted from the light emitter and to emit green-based light so that the least one light source emits a mixture of blue-based light and green-based light.

2. The display device of claim 1, wherein the at least one light converter particle comprises a second green light converting element embedded in the light emitter main body, wherein the second green light converting element comprises at least one of a green quantum dot particle and a green fluorescent particle.

3. The display panel of claim 1, wherein said quantum dot converter is configured to primarily emit converted light that is colored different than the color emitted from the light source; and the light transmitter is configured to primarily emit a mixture of (a) non-converted light of the color emitted from the light source and (b) the converted light of the different color than that emitted from the light source.

* * * * *